United States Patent
Katsuzawa

(10) Patent No.: US 7,979,830 B2
(45) Date of Patent: Jul. 12, 2011

(54) LAYOUT DESIGN METHOD FOR A SEMICONDUCTOR INTEGRATED CIRCUIT

(75) Inventor: Mitsuyuki Katsuzawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 296 days.

(21) Appl. No.: 12/213,963

(22) Filed: Jun. 26, 2008

(65) Prior Publication Data

US 2009/0013296 A1 Jan. 8, 2009

(30) Foreign Application Priority Data

Jul. 3, 2007 (JP) ................................ 2007-175057

(51) Int. Cl.
*G06F 17/50* (2006.01)

(52) U.S. Cl. ........ 716/122; 716/123; 716/129; 716/130; 716/136

(58) Field of Classification Search .................... 716/13, 716/14, 9, 10, 122, 123, 129, 130, 136
See application file for complete search history.

(56) References Cited

U.S. PATENT DOCUMENTS

| | | | | |
|---|---|---|---|---|
| 5,309,371 A * | 5/1994 | Shikata et al. | | 716/10 |
| 5,583,788 A * | 12/1996 | Kuribayashi | | 716/14 |
| 6,226,775 B1 * | 5/2001 | Yamada | | 716/2 |
| 6,298,468 B1 * | 10/2001 | Zhen | | 716/2 |
| 6,397,375 B1 * | 5/2002 | Block et al. | | 716/14 |
| 6,536,030 B1 * | 3/2003 | Tanaka | | 716/17 |
| 6,594,805 B1 * | 7/2003 | Tetelbaum et al. | | 716/5 |
| 6,725,440 B2 * | 4/2004 | Takenaka | | 716/13 |
| 6,845,489 B1 * | 1/2005 | Mizuno et al. | | 716/1 |
| 6,934,925 B2 * | 8/2005 | Nonaka | | 716/14 |
| 7,032,207 B2 * | 4/2006 | Kurose et al. | | 716/12 |
| 7,249,336 B2 * | 7/2007 | Nagata et al. | | 716/13 |
| 2002/0170029 A1 * | 11/2002 | Sriram et al. | | 716/13 |
| 2003/0084417 A1 * | 5/2003 | Baba | | 716/10 |
| 2003/0135837 A1 * | 7/2003 | Okabe | | 716/12 |
| 2003/0217348 A1 * | 11/2003 | Nonaka | | 716/13 |
| 2003/0226126 A1 * | 12/2003 | Iwai et al. | | 716/6 |
| 2004/0168144 A1 * | 8/2004 | Kurose et al. | | 716/12 |
| 2005/0138593 A1 * | 6/2005 | Okumura | | 716/13 |
| 2007/0235766 A1 * | 10/2007 | Kojima et al. | | 257/208 |
| 2007/0256044 A1 * | 11/2007 | Coryer et al. | | 716/13 |
| 2008/0263493 A1 * | 10/2008 | Berry et al. | | 716/12 |

FOREIGN PATENT DOCUMENTS

| | | |
|---|---|---|
| JP | 10-107149 | 4/1998 |
| JP | 11-145296 | 5/1999 |

* cited by examiner

*Primary Examiner* — Phallaka Kik
(74) *Attorney, Agent, or Firm* — McGinn IP Law Group, PLLC

(57) ABSTRACT

A method of designing a layout of a semiconductor integrated circuit having a hard macro includes acquiring a condition for permitting wirings with respect to a given region within the hard macro, and searching a passing wiring that passes through the given region among the wirings that are arranged on the semiconductor integrated circuit. The method further includes allowing a normal passing wiring that satisfies the condition to pass through the hard macro, and wiring a defaulting passing wiring that does not satisfy the condition so as to bypass the hard macro among the searched passing wirings.

20 Claims, 19 Drawing Sheets

40: PASSING WIRING

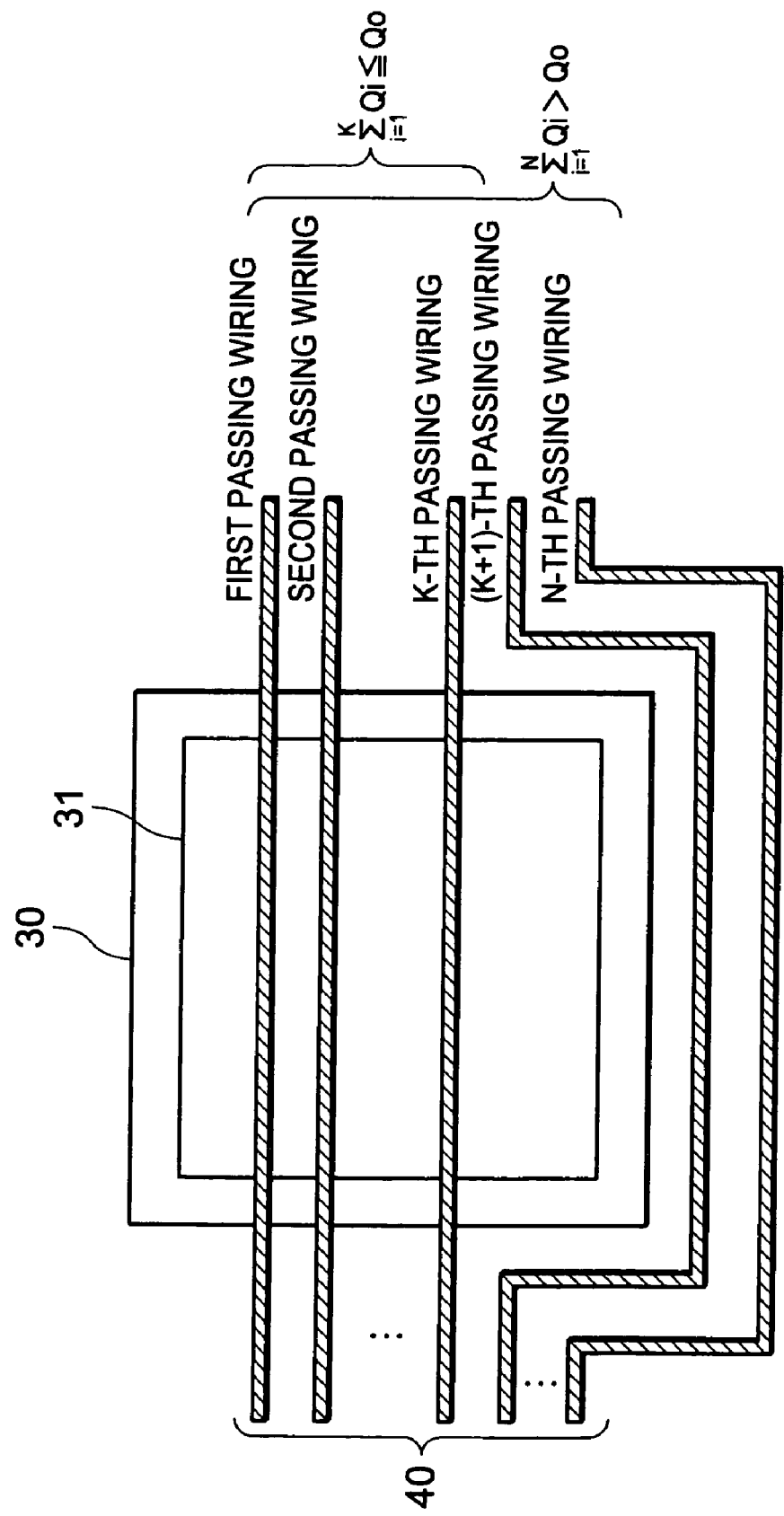

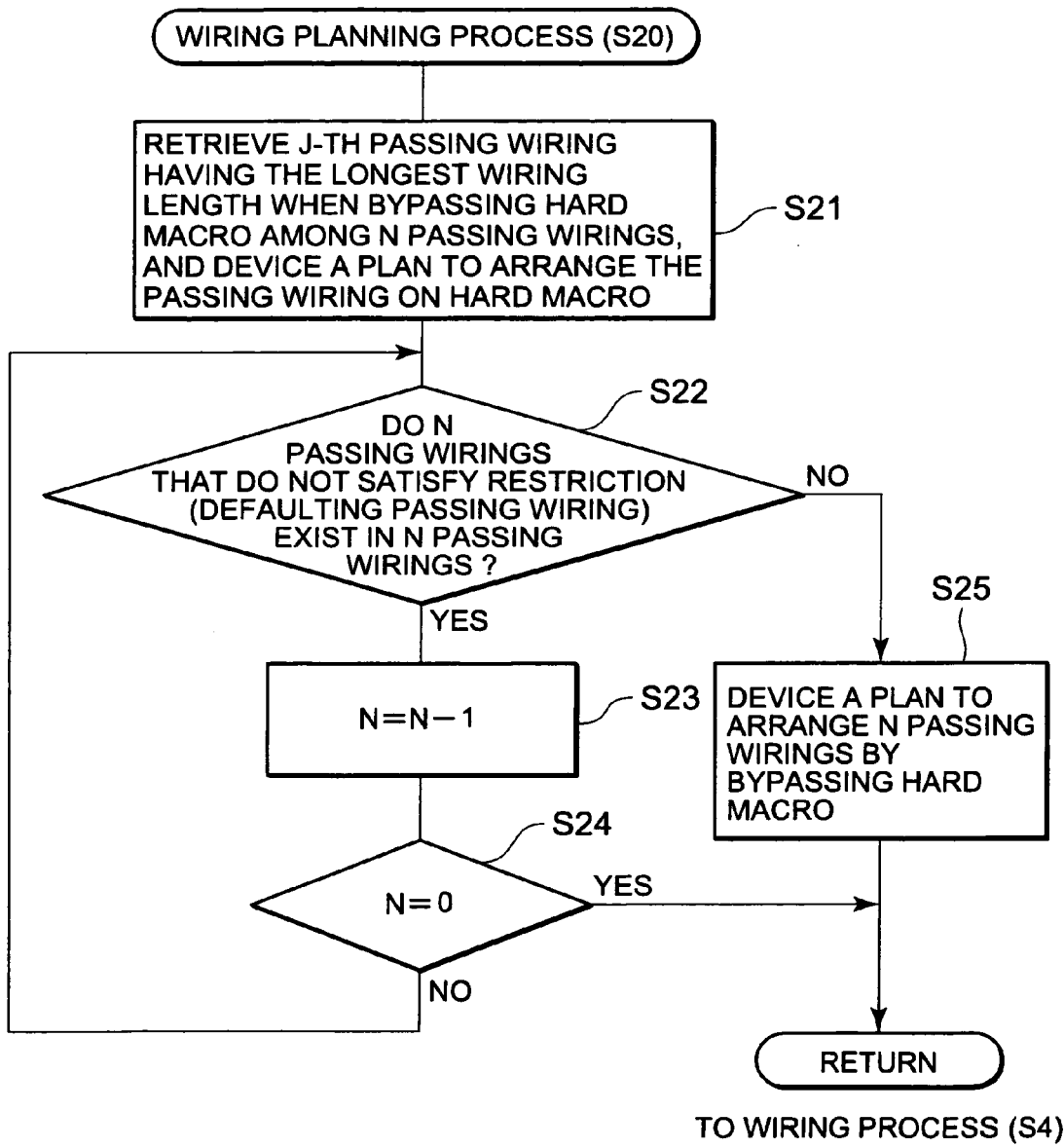

LAYOUT DESIGN METHOD FOR A SEMICONDUCTOR INTEGRATED CIRCUIT

BACKGROUND OF THE INVENTION

1. Field of the Invention

The present invention relates to a layout design method for a semiconductor integrated circuit.

2. Description of the Related Art

There has been developed a layout design method that designs the layout of a semiconductor integrated circuit. The semiconductor integrated circuit is equipped with a hard macro that is disposed on a chip, and a passing wiring. When the hard macro is a memory macro, a DRAM (dynamic random access memory) macro and an SRAM (static random access memory) macro have been widely known. In the design method, the passing wiring is arranged on an upper layer of the hard macro as a macro outer wiring with respect to the layout data in which the hard macro is arranged in a coordinate region. However, there is a risk that the hard macro malfunctions due to an influence of the noises depending on a portion where the passing wiring is arranged. For that reason, a given region within the hard macro is regarded as a wiring obstruction region (OBS), the passing wiring on the hard macro is obstructed, and the passing wiring bypasses the hard macro, thereby making it possible to reduce an influence of the noises.

In recent years, higher integration has been further demanded on the semiconductor integrated circuit. The higher integration leads to an increase in the number of passing wirings. However, when all of the passing wirings bypass the hard macro, a region for the bypassed passing wirings needs to be ensured, which interferes with the higher integration. Under the circumstances, a part of passing wirings is disposed on the hard macro, and other passing wirings bypass the hard macro, thereby making it possible to reduce an influence of the noises without preventing the higher integration.

For example, JP Hei 10-107149A discloses a technique in which attributes are given the hard macro and all of the passing wirings (net). In the technique, the passing wiring whose attribute coincides with the attribute of the hard macro among all of the passing wirings is disposed on the hard macro, and other passing wirings bypass the hard macro. In the case where the attribute of the passing wiring coincides with the attribute of the hard macro, as the attribute of the passing wiring, there are attributes that a voltage level represented by a signal which is transmitted from the passing wiring is held constant, that the signal is synchronous with the operation of the hard macro, and that the passing wiring is a test signal line.

Also, JP Hei 11-145296A discloses a technique in which the bypass wiring is arranged within the hard macro in advance as a method of inhibiting the passing wiring on the hard macro, and preventing the passing wiring from bypassing the hard macro. In that technique, in the case where the hard macro exists on a line that connects one block and another block when the passing wiring extends from the one block to the another block, the passing wiring from the one block is connected to one end of the bypass wiring, and the passing wiring from the another block is connected to another end of the bypass wiring.

SUMMARY

As described above, there has been demanded a semiconductor integrated circuit that realizes the higher integration and is insusceptible to noises. Accordingly, even in the case of developing the semiconductor integrated circuit, there is desired a technique in which the semiconductor integrated circuit can be automatically designed so as not to strain a designer.

However, in the technique disclosed in JP Hei 10-107149A, the designer must give the attribute to all of the passing wirings (net) in order to make the attribute of the hard macro coincide with the attribute of the passing wiring. The number of passing wirings is not several tens but reaches several hundreds. Also, the technique is insufficient to determine whether the passing wiring is disposed on the hard macro, or not, according to the above attribute. As described above, the technique disclosed in JP Hei 10-107149A is not suitable for practical use.

Also, in the technique disclosed in JP Hei 11-145296, the designer must arrange the bypass wiring within the hard macro before arranging the passing wiring. Because the bypass wiring per se has a float potential where the potential is unstable, there is a risk that the hard macro malfunctions due to the influence of the noises. Also, in the case where the bypass wiring is not used when the passing wiring is arranged, a region in which the bypass wiring is arranged gets useless. For that reason, the technique disclosed in JP Hei 11-145296 is suitable for practical use.

The present invention seeks to solve one or more of the above problems, or to improve upon those problems at least in part.

In one embodiment, a method of designing a layout of a semiconductor integrated circuit includes acquiring circuit information of the semiconductor integrated circuit and an admissibility condition for permitting a wiring with respect to a given region within the hard macro, searching N passing wirings, N being a positive integer, which pass through the given region among wirings which are arranged in the semiconductor integrated circuit, allowing a normal passing wiring which satisfies the admissibility condition among the N passing wirings to pass through the hard macro, and wiring a defaulting passing wiring which does not satisfy the admissibility condition so as to bypass the hard macro.

With the above configuration, in the layout design method for the semiconductor integrated circuit according to the present invention, the semiconductor integrated circuit can be designed so as to realize the higher integration, and not to strain a designer when developing the semiconductor integrated circuit which is insusceptible to noises.

This is because the designer provides a computer (1) with the admissibility condition (23) for permitting the wiring with respect to the given region (31) within the hard macro (30) in advance, and the computer (1) searches the passing wiring (40) that passes through the given region (31) from the wirings that are arranged in the semiconductor integrated circuit in the wiring design step (S10, S20, and S30), allows the normal passing wiring (41) that satisfies the admissibility condition (23) to pass through the hard macro (30) among the searched passing wirings (40), and wires the defaulting passing wiring (42) that does not satisfy the admissibility condition (23) so as to bypass the hard macro (30) in the wiring step (S4). In this case, the designer is required to only supply the admissibility condition (23) to a library (20) for a design tool (layout tool), or to the design tool by a command, and reduces a strain of the designer as compared with the technique disclosed in JP Hei 10-107149 or JP Hei 11-145296. That is, the designer does not need to supply the attributes to all of the passing wirings (net), or arrange the bypass wiring within the hard macro.

The admissibility condition (23) is exemplified by an allowable capacitance (Co), an allowable resistance (Ro), an allowable number, and an allowable area (Qo).

When the allowable condition (23) includes the allowable capacitance (Co), the defaulting passing wiring (42) represents that a capacitance (C) representative of a coupling capacitor which is formed by the passing wiring (40) that is virtually arranged on the given region (31) and the wiring of the hard macro (30) in the given region (31) exceeds the allowable capacitance (Co). In this case, it is preferable to calculate the value of the coupling capacitance which is formed by an overlap portion (40-2) representative of a portion corresponding to the given region (31) of the passing wiring (40) and the wiring of the hard macro (30) in the given region (31) as the capacitance (C).

When the admissibility condition (23) includes the admissibility resistance (Ro), the defaulting passing wiring (42) represents that a resistance (R) representative of a resistance which occur in the passing wiring (40) that is virtually arranged on the given region (31) exceeds the allowable resistance (Ro). In this case, it is preferable to calculate the value of the resistor that occurs in the overlap portion (40-2) representative of a portion corresponding to the given region (31) of the passing wiring (40) as the resistance (R).

When the admissibility condition (23) includes the allowable number, and the allowable number is I (I is an integer equal to or higher than 1), the defaulting passing wiring (42) represents that the passing wirings (40) that are virtually arranged on the given region (31) are (I+1)-th and subsequent passing wirings.

When the admissibility condition (23) includes the allowable area (Qo), the normal passing wirings (41) represents first to K-th (K is an integer equal to or higher than 1) passing wirings (40) when a total area (Qtotal) that is determined by the areas (Qi) and the number of passing wirings (40) which are virtually arranged on the given region (31) is equal to or lower than the allowable area (Qo). In this case, the defaulting passing wirings (42) represent (K+1)-th and subsequent passing wirings (40) when the total area (Qtotal) exceeds the allowable area (Qo). It is preferable to calculate the area of the overlap portion (40-2) representative of a portion corresponding to the given region (31) of the passing wirings (40) as the area (Qi).

In the wiring design step (S10), the computer (1) devises a plan to virtually arrange all of N passing wirings (40) on the given region (31) as a plurality of passing wirings (40), and changes the plan when the defaulting passing wiring (42) exists in the N passing wirings (40). When the order of wiring of the N passing wirings (40) can be changed, it is preferable to execute the wiring design step (S10).

In the wiring plan step (S20), the computer (1) devises a plan to virtually arrange the N passing wirings (40) in the given region (31) one by one so that the defaulting passing wirings (42) do not exist after the N passing wirings (40) are arranged as the plurality of passing wirings (40). When the order of wiring of the N passing wirings (40) is not desired to be changed, it is preferable to execute the wiring plan step (S20).

In the wiring plan step (S30), the computer (1) devises a plan to virtually arrange all of the N passing wirings (40) on the given region (31) as the plurality of passing wirings (40), and changes the plan when the defaulting passing wiring (42) exists in the N passing wirings (40) In this example, when M (M is an integer that satisfies M≦N) defaulting passing wirings (42) exist in the N passing wirings (40), the computer (1) devises a plan to virtually arrange M passing wirings (40) on the given region (31) one by one. In this way, it is possible to execute the wiring plan step (S10) and the wiring plan step (S20).

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9C is a diagram for explaining the present invention (in the case where the admissibility condition includes the allowable area);

FIG. 13 is a flowchart showing a wiring planning process in FIG. 12;

DETAILED DESCRIPTION OF THE PREFERRED EMBODIMENTS

Hereinafter, a description will be given in more detail of a layout design method for a semiconductor integrated circuit according to the present invention with reference to the accompanying drawing.

First Embodiment

Figure 1:
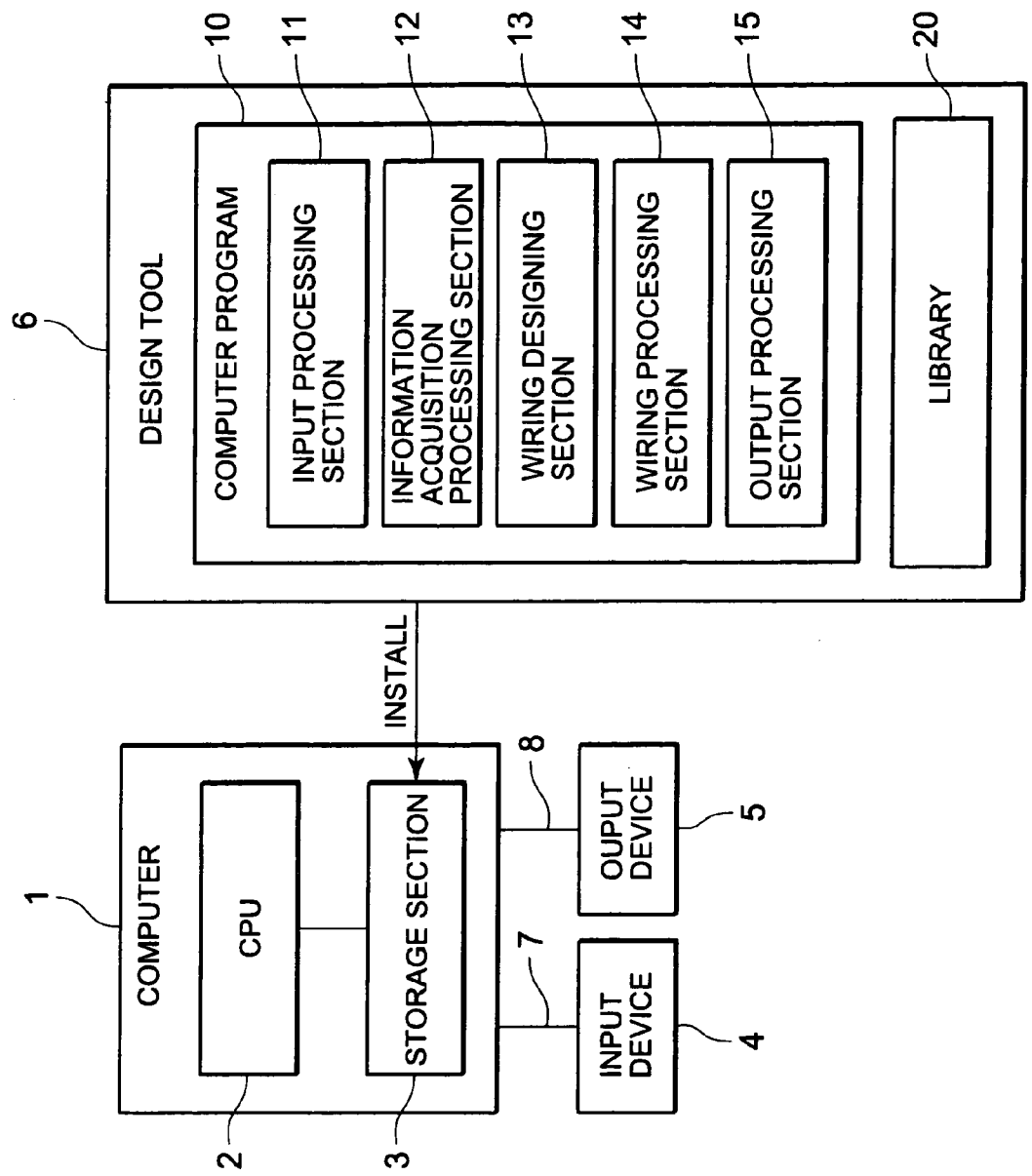
FIG. 1 is a diagram showing the configuration of a design system to which a layout design method for a semiconductor integrated circuit according to the present invention is applied.

FIG. 1 shows the configuration of a design system to which a layout design method for a semiconductor integrated circuit according to the present invention is applied. The design system includes a computer 1, an input device 4, and an output device 5. The input device 4 and the output device 5 are connected to the computer 1. The output device 5 includes a display device and a printing device.

The computer 1 includes a storage unit 3 that stores computer program therein, and a CPU (central processing unit) 2 that is an execution unit that executes the computer program.

The design system also includes a design tool 6 that is software. The design tool 6 is installed in the storage unit 3.

The computer program 10 includes an input processing unit 11, an information acquisition processing unit 12, a wiring design processing unit 13, a wiring processing unit 14, and an output processing unit 15.

Figure 2:
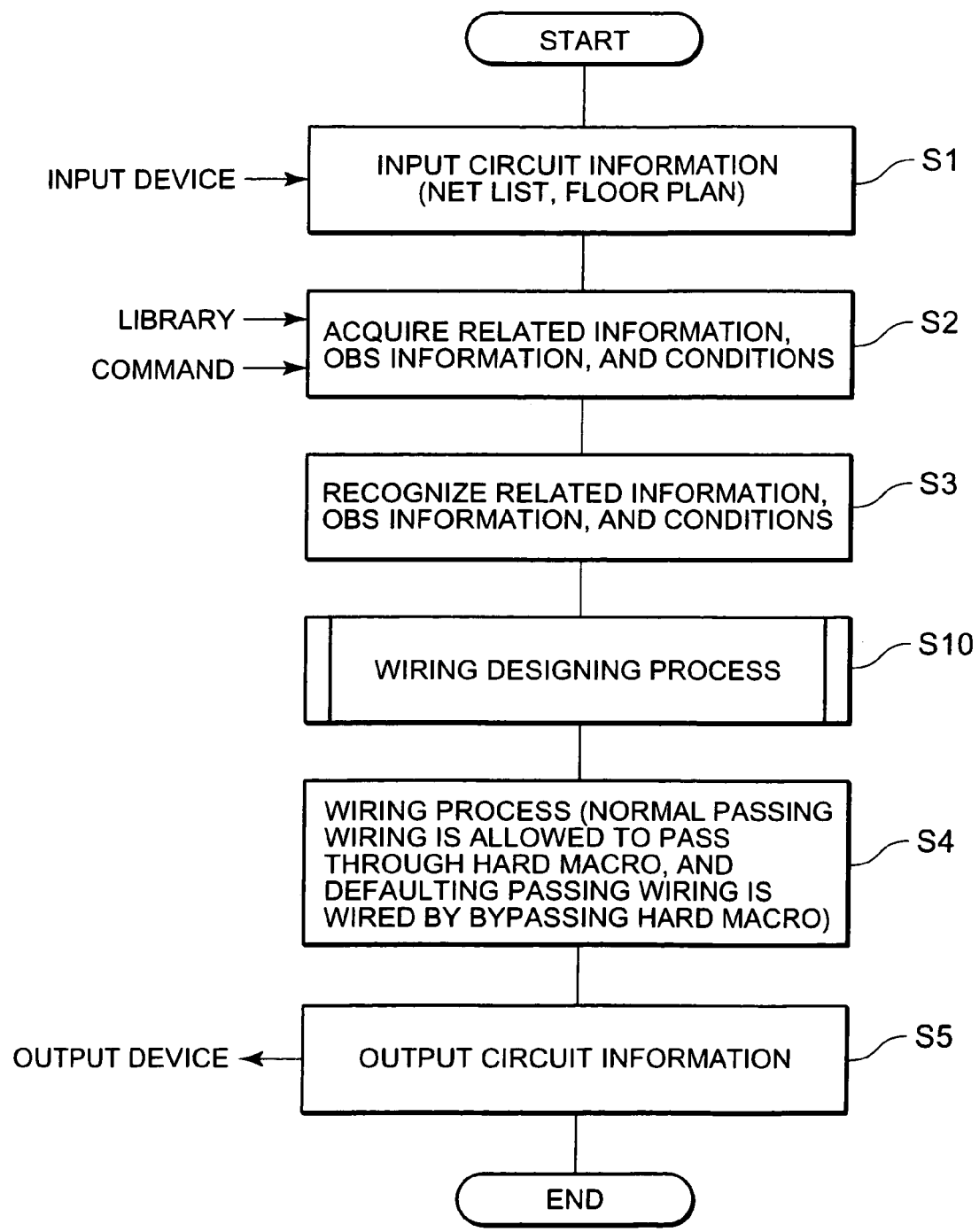
FIG. 2 is a flowchart showing the operation of a computer, which is representative of a layout design method for a semiconductor integrated circuit according to a first embodiment of the present invention.

FIG. 2 is a flowchart showing the operation of the computer 1, which is representative of a layout design method for a semiconductor integrated circuit according to a first embodiment of the present invention.

A designer supplies the circuit information representative of the semiconductor integrated circuit to the computer 1 by the aid of the input device 4. The semiconductor integrated circuit includes plural hard macros. The input processing unit 11 inputs the circuit information 7 (Step S1).

Figure 3:
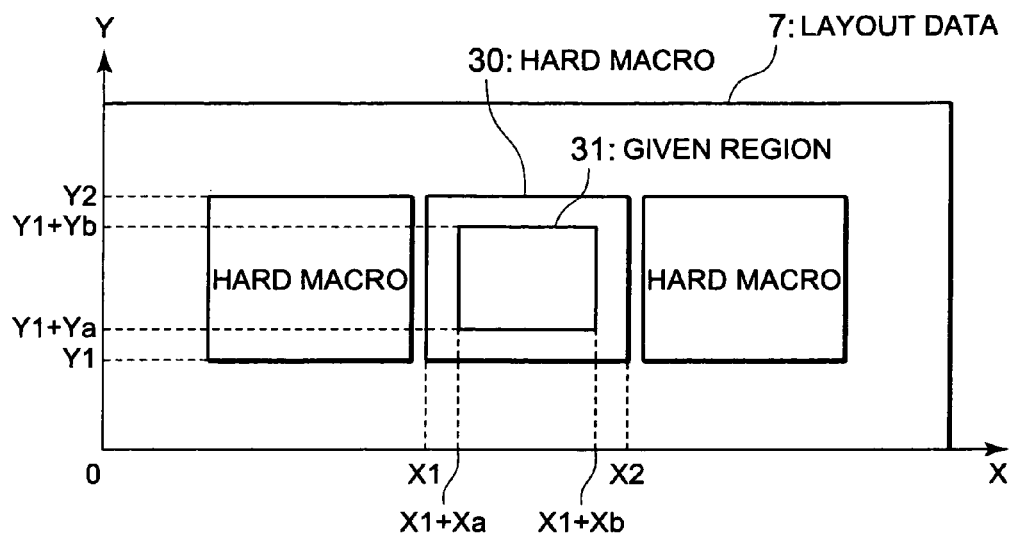
FIG. 3 is a diagram showing circuit information 7 in FIG. 1.

The circuit information 7 includes a net list representative of circuits that constitute each of the plural hard macros of the semiconductor integrated circuit. As shown in FIG. 3, the circuit information 7 also includes a floor plan representative of coordinates (0,0), (X,0), (0,Y) and (X,Y) where the semiconductor integrated circuit is arranged. In this example, symbols X and Y are arbitrary integers. The plural hard macros are disposed at the coordinates (0,0), (X, 0), (0,Y) and (X,Y). For example, it is assumed that coordinates (X1, Y1), (X1, Y2), (X2, Y1), and (X2, Y2) at which the hard macro 30 among the plural hard macros is arranged. In this example, X1<X2<X is satisfied, and Y1<Y2<Y is satisfied. Also, it is assumed that coordinates indicative of a given region 31 of the hard macro 30 are (X1+Xa, Y1+Ya) (X1+Xa, Y1+Yb), (X1+Xb, Y1+Ya), and (X1+Xb, Y1+Yb). In this example, $0 \leq Xa < Xb \leq (X2-X1)$, and $0 \leq Ya < Yb \leq (Y2-Y1)$ is satisfied.

Figure 4:
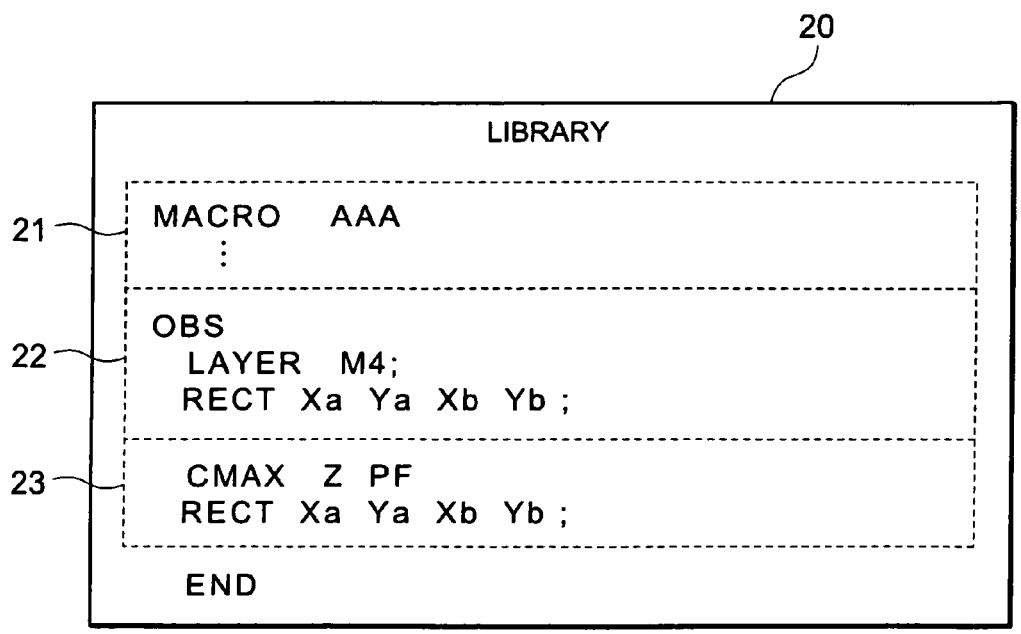
FIG. 4 is a diagram showing a library in FIG. 1

As shown in FIG. 4, related information 21 that is related to the hard macro 30, OBS information 22 representative of a wiring obstruction region (OBS), and an admissibility condition 23 are stored in the library 20.

The OBS information 22 includes NG information indicating that, for example, a third wiring is a passing obstruction, and coordinates (OBS coordinates) indicative of OBS. The NG information is described as, for example, "LAYER M3". The OBS coordinates indicate the same coordinates as the coordinates (X1+Xa, Y1+Ya) (X1+Xa, Y1+Yb), (X1+Xb, Y1+Ya), and (X1+Xb, Y1+Yb) indicative of the given region 31, and are described as, for example, "RECT Xa Ya Xb Yb".

The admissibility condition 23 includes information for permitting a predetermined wiring with respect to the given region 31 within the hard macro 30, and coordinates representative of a region that is subjected to that information. The coordinates indicate the same coordinates as the coordinates (X1+Xa, Y1+Ya) (X1+Xa, Y1+Yb), (X1+Xb, Y1+Ya), and (X1+Xb, Y1+Yb) indicative of the given region 31, and are described as, for example, "RECT Xa Ya Xb Yb".

The hard macro 30 is so designed as not to operationally suffer from any problem when the wiring that satisfies the admissibility condition 23 is arranged in the given region 31 indicated by the OBS information 22 (for example, a region in which the bit line is arranged in the case of a memory macro). The above admissibility condition 23 will be described in more detail later.

The information acquisition processing unit 12 acquires the related information 21, the OBS information 22, and the admissibility condition 23 from the library 20, and notifies the wiring plan processing 13 of the above information (Step S2). Also, when the admissibility condition 23 is stored in the library 20, or when a new admissibility condition 23 is added, the designer is capable of supplying the admissibility condition 23 to the information acquisition processing unit 12 as a command by the aid of the input device 4. In this case, the information acquisition processing unit 12 acquires the admissibility condition 23, and notifies the wiring plan processing unit 13 of the admissibility condition 23.

The wiring plan processing unit 13 recognizes the related information 21, the OBS information 22, and the admissibility condition 23 from the information acquisition processing unit 12 (Step S3).

Figure 5A:
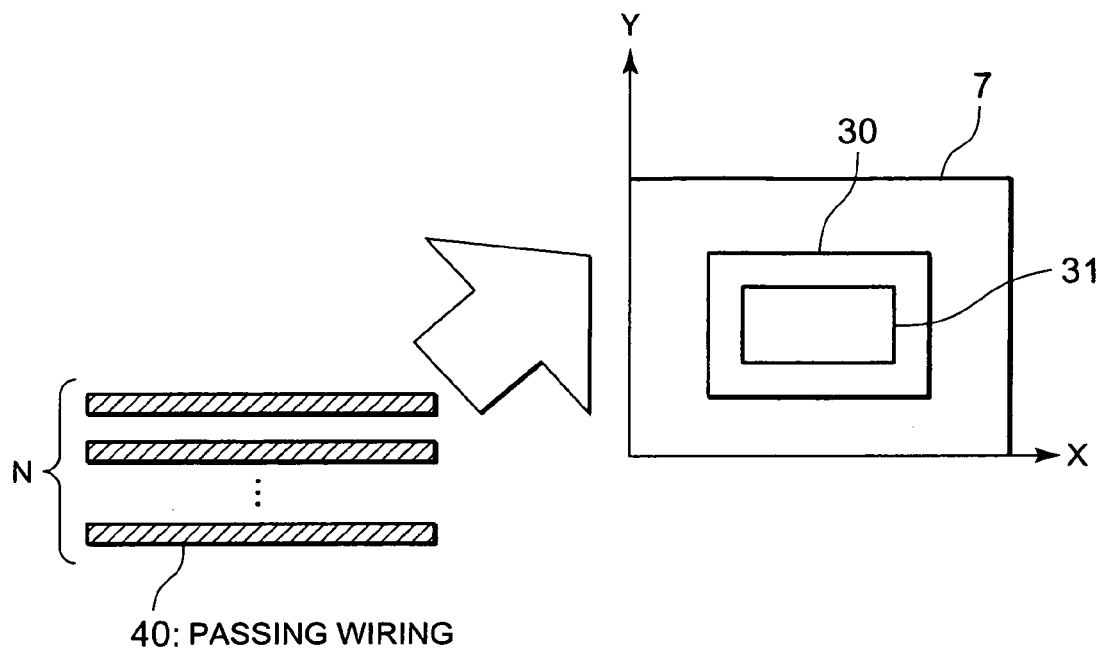
FIG. 5A is a diagram for explaining the present invention.
Figure 5B:
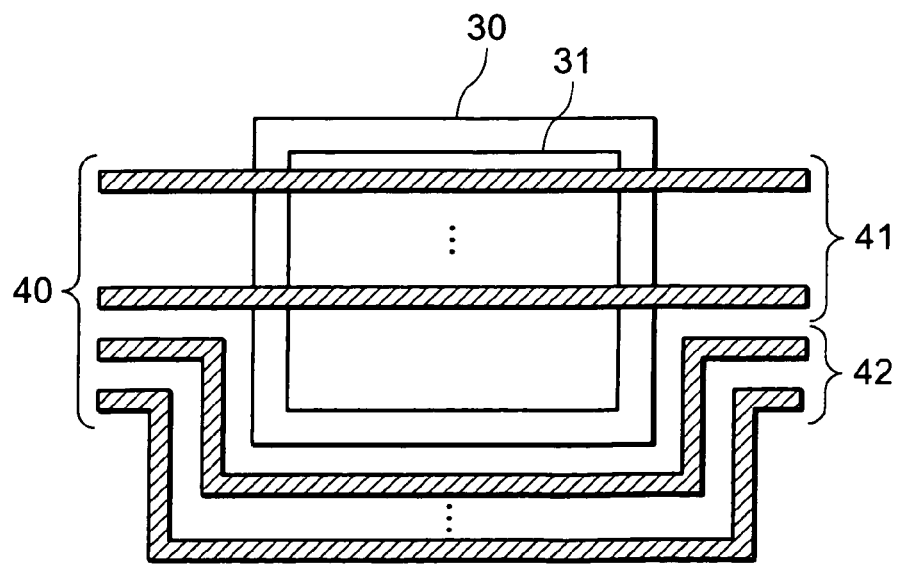
FIG. 5B is a diagram for explaining the present invention.

As shown in FIG. 5A, the wiring plan processing unit 13 executes a wiring planning process that searches N (N is an integer equal to or higher than 2) passing wirings 40 which pass through the given region 31 within the hard macro 30 from the wirings that are arranged in the semiconductor integrated circuit (Step S10). The passing wiring 40 represents a wiring that passes through the hard macro 30, for example, when the wiring for connecting between one macro and another macro is arranged at the shortest distance. In the wiring planning process (Step S10), as shown in FIG. 5B, the wiring plan processing unit 13 searches a normal passing wiring 41 that satisfies the admissibility condition 23 and a defaulting passing wiring 42 that does not satisfy the admissibility condition 23 from the N passing wirings 40. This operation will be described in more detail later.

The wiring processing unit 14 executes the wiring process on the basis of the execution result of the wiring planning process (Step S10) (Step S4). In the wiring process (Step S4), the normal passing wiring 41 is allowed to pass through the hard macro 30, and the defaulting passing wiring 42 is wired to bypass the hard macro 30. The wiring processing unit 14 outputs the circuit information 7 in which the normal passing wiring 41 and the defaulting passing wiring 42 are arranged in the semiconductor integrated circuit to the output device 5 as circuit information 8 (Step S5).

Now, the admissibility condition 23 will be described. It is assumed that the above related information 21 includes the respective widths (diameters), cross sections, and resistivity of the N passing wirings 40.

Figure 6A:
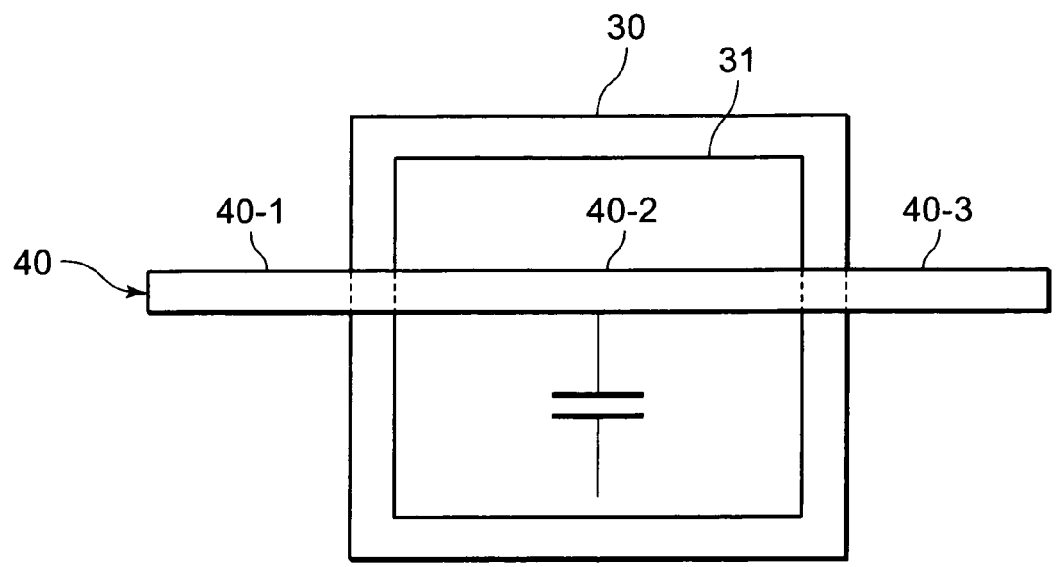
FIG. 6A is a diagram for explaining the present invention (in the case where an admissibility condition includes an allowable capacitance)
Figure 6B:
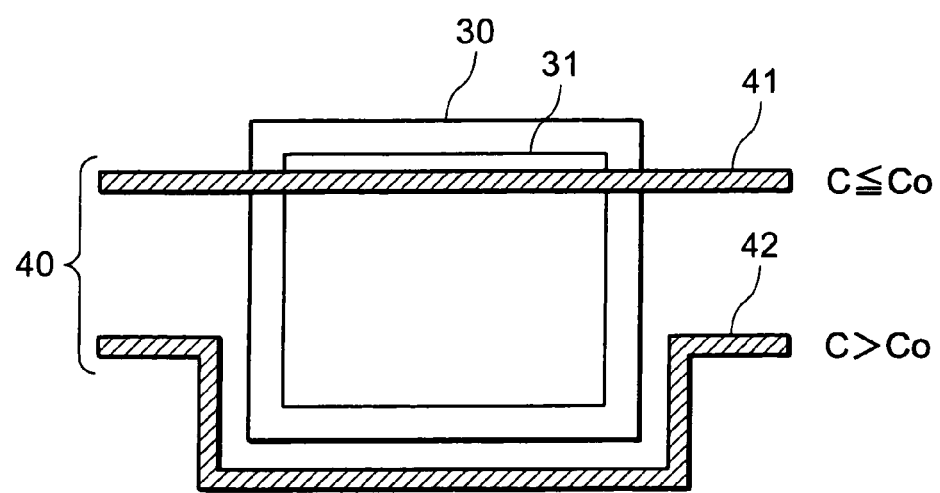
FIG. 6B is a diagram for explaining the present invention (in the case where the admissibility condition includes the allowable capacitance)

The above admissibility condition 23 includes an admissibility capacitance Co. For example, in the case of FIG. 4, the admissibility condition 23 is described as "CMAX ZPF". In this example, symbol Z is an arbitrary real number, and PF is a unit of the capacitance. The wiring plan processing unit 13 calculates a capacitance C representative of the coupling capacitance that is formed by the passing wiring 40 that is virtually arranged on the given region 31 and the wiring of the hard macro 30 in the given region 31. More specifically, as shown in FIG. 6A, the wiring plan processing unit 13 divides the passing wiring 40 into an overlap portion 40-2 representative of a portion corresponding to the given region 31, and other portions 40-1 and 40-3, and calculates a capacitance C that is formed by the overlap portion 40-2 and the wiring of the hard macro 30 in the given region 31. Under the circumstances, the wiring plan processing unit 13 provides the above passing wiring 40 as the normal passing wiring 41 when the capacitance C is equal to or lower than the allowable capacitance Co as shown in FIG. 6B. On the other hand, when the capacitance C exceeds the allowable capacitance Co, the above passing wiring 40 is provided as the defaulting passing wiring 42.

Figure 7A:
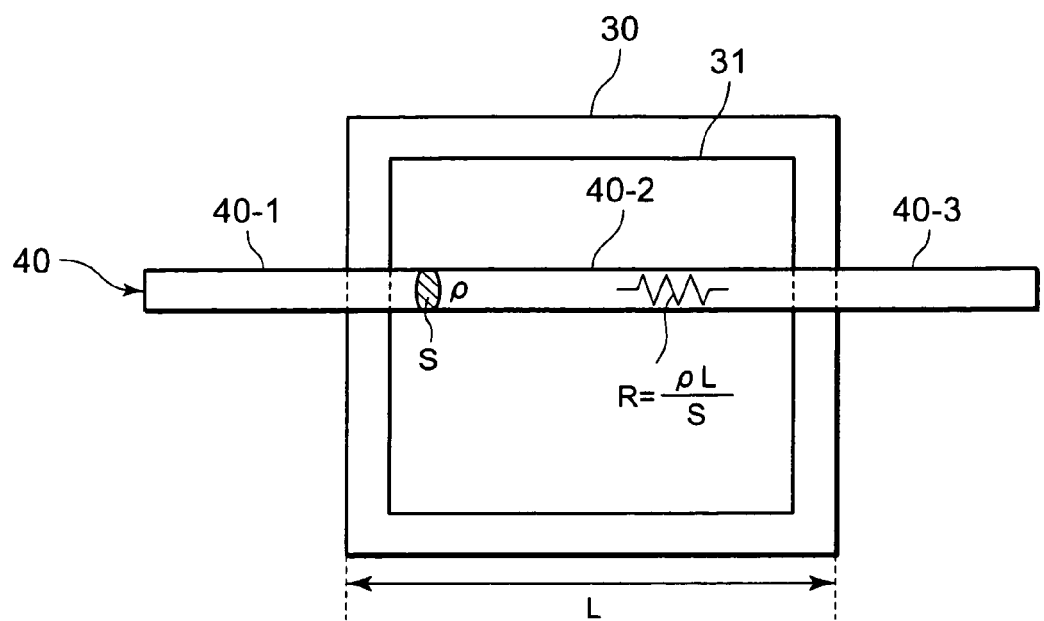
FIG. 7A is a diagram for explaining the present invention (in the case where the admissibility condition includes an allowable resistance)
Figure 7B:
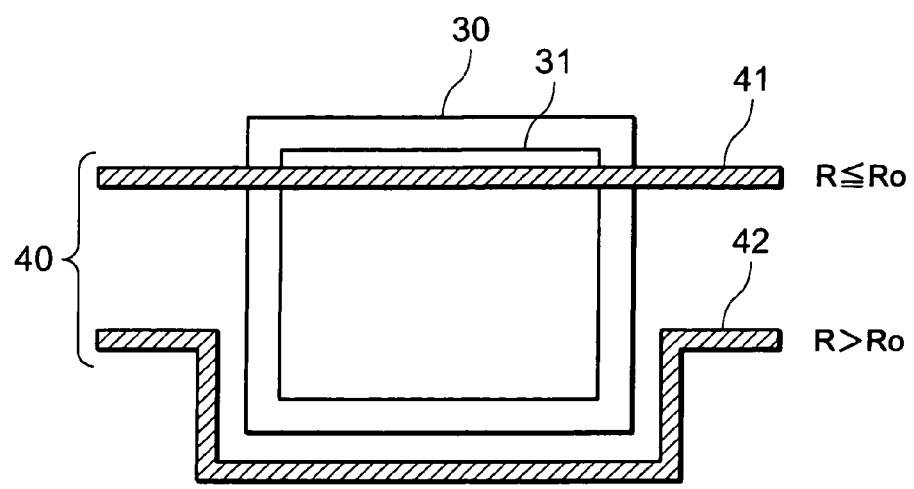
FIG. 7B is a diagram for explaining the present invention (in the case where the admissibility condition includes the allowable resistance)

The above admissibility condition also includes the allowable resistance Ro. The wiring plan processing unit 13 calculates the resistance R representative of a resistor that occurs in the passing wiring 40 which is virtually arranged on the given region 31. More specifically, as shown in FIG. 7A, the wiring plan processing unit 13 divides the passing wiring 40 into an overlap portion 40-2 representative of a portion corresponding to the given region 31, and other portions 40-1 and 40-3, and calculates a resistance R of a resistor that occurs in the overlap portion 40-2. In this example, when it is assumed that a length of the overlap portion 40-2 is L (for example, a linear distance (Xb−Xa) between the coordinates (X1+Xa) and the coordinates (X1+Xb)), a cross section of the overlap portion 40-2 is S, and the resistivity of the overlap portion 40-2 is ρ, the resistance R is calculated by ρ×L/S. Under the circumstances, as shown in FIG. 7B, the wiring plan processing unit 13 provides the above passing wiring 40 as the normal passing wiring 41 when the resistance R is equal to or lower than the allowable resistance Ro. On the other hand, when the resistance R exceeds the allowable resistance Ro, the passing wiring 40 is provided as the defaulting passing wiring 42. Also, the resistance R can be calculated by the aid of a predetermined sheet resistance. In this case, when it is assumed that a length of the overlap portion 40-2 is L, a width (diameter) of the overlap portion 40-2 is W, and the sheet resistance is Rs, the resistance R is calculated by Rs×L/W.

Figure 8A:
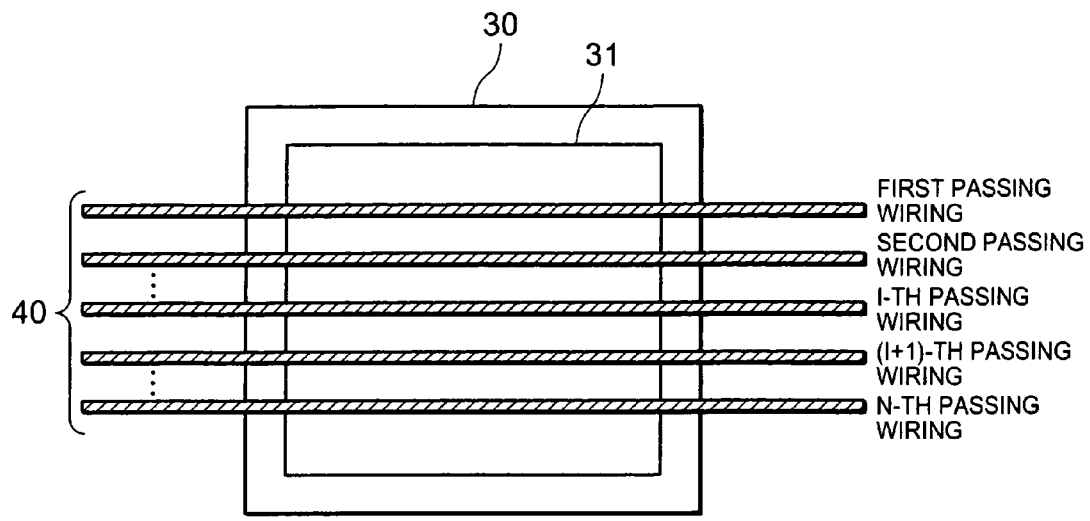
FIG. 8A is a diagram for explaining the present invention (in the case where the admissibility condition includes an allowable number)
Figure 8B:
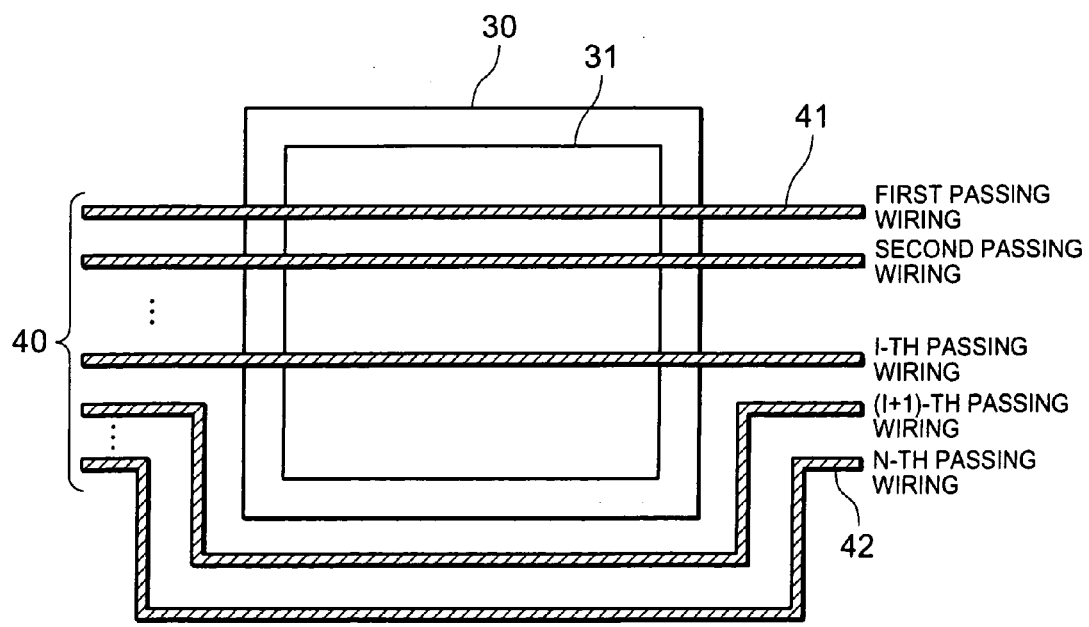
FIG. 8B is a diagram for explaining the present invention (in the case where the admissibility condition includes the allowable number)

The above admissibility condition 23 also includes an allowable number. The allowable number limits the number of passing wirings 40 which are arranged on the given region 31, and it is assumed that the allowable number is I. In this example, it is assumed that I is an integer equal to or more than 1, which is, for example, an integer that satisfies 1≦I≦N. As shown in FIG. 8A, the wiring plan processing unit 13 virtually arranges N first to N-th passing wirings 40 on the given region 31 in the stated order. Under the circumstances, the wiring plan processing unit 13 provides the first to I-th passing wirings 40 as the normal passing wirings 41 as shown in FIG. 8B. On the other hand, the (I+1)-th and subsequent passing wirings 40 are provided as the defaulting passing wirings 42.

Figure 9A:
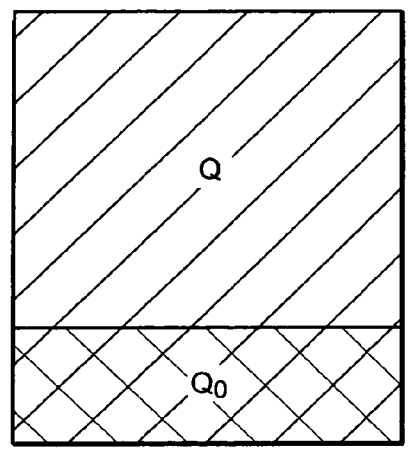
FIG. 9A is a diagram for explaining the present invention (in the case where the admissibility condition includes an allowable area)
Figure 9B:
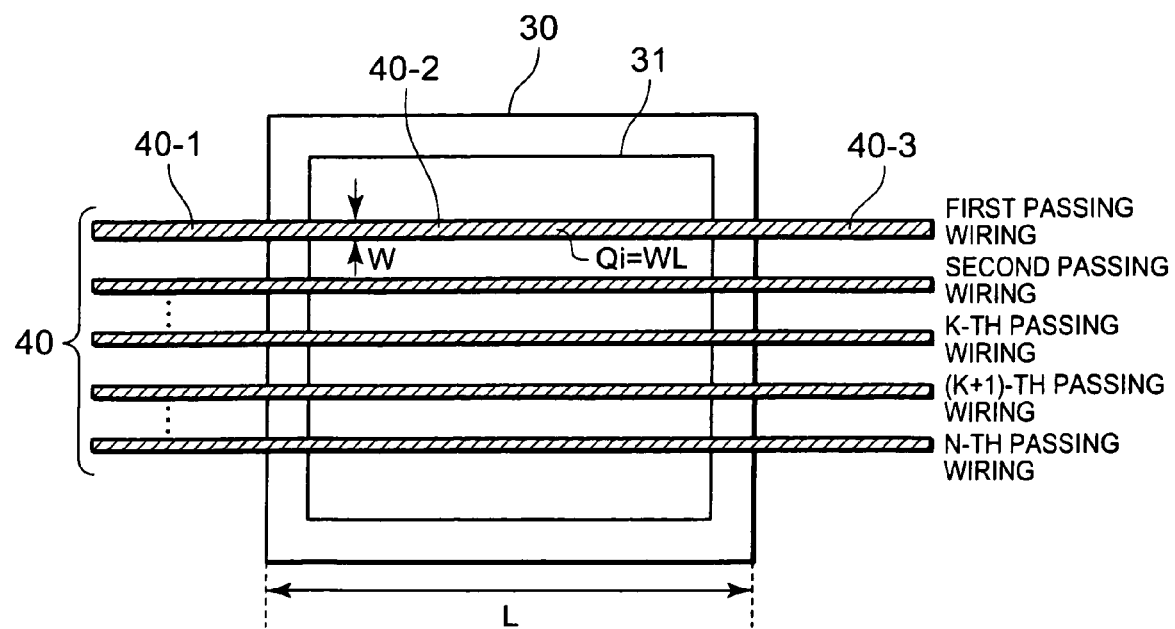
FIG. 9B is a diagram for explaining the present invention (in the case where the admissibility condition includes the allowable area)

The above admissibility condition 23 further includes the allowable area Qo. As shown in FIG. 9A, limits the area of the passing wiring 40 that is arranged on the given region 31 when it is assumed that the area of the given region 31 is Q, and Qo<Q is satisfied. When this is represented by the area ratio, Qo/Q is satisfied. As shown in FIG. 9B, the wiring plan processing unit 13 virtually arranges the N first to N-th passing wirings 40 on the given region 31 in the stated order. The wiring plan processing unit 13 calculates a total area Qtotal which is determined according to the area Qi and the number of passing wirings 40 that are virtually arranged on the given region 31. More specifically, the wiring plan processing unit 13 divides the passing wiring 40 into the overlap portion 40-2 representative of a portion corresponding to the given region 31, and the other portions 40-1 and 40-3, and calculates the area Qi of the overlap portion 40-2. In this example, when it is assumed that a length of the overlap portion 40-2 is L (for example, a linear distance (Xb−Xa) between the coordinates (X1+Xa) and the coordinates (X1+Xb)), and a width (diameter) of the overlap portion 40-2 is W, the area Qi is calculated by W×L. Also, the total area Qtotal is represented by Expression 1. Under the circumstances, it is assumed that the first to K-th passing wirings 40 when the total area Qtotal is equal to or smaller than the allowable area Qo is the normal passing wiring 41, as shown in FIG. 9C and Expression 2. In this example, it is assumed that K is an integer equal to or higher than 1, which is an integer that satisfies 1≦K<N. On the other hand, as shown in FIG. 9C and Expression 3, the (K+1)-th and subsequent passing wirings 40 when the total area Qtotal exceeds the allowable area Qo is the defaulting passing wiring 42.

$$Q_{total} = \sum Qi \qquad \text{Ex. 1}$$

$$Q_{total} = \sum_{i=1}^{K} Qi \leq Q_o \qquad \text{Ex. 2}$$

$$Q_{total} = \sum_{i=1}^{N} Qi > Q_o \qquad \text{Ex. 3}$$

In the layout design method for the semiconductor integrated circuit according to the present invention, the designer can supply the admissibility condition 23 for permitting the predetermined wiring with respect to the given region 31 within the hard macro 30 to the library 20 for the design tool or to the design tool according to a command. In this situation, the computer 1 searches the passing wiring 40 that passes through the given region 31 among the wirings that are arranged in the semiconductor integrated circuit in the wiring planning process (Step S10). The computer 1 also allows the normal passing wiring 41 that satisfies the admissibility condition 23 to pass through the hard macro 30, and wires the defaulting passing wiring 43 that does not satisfy the admissibility condition 23 so as to bypass the hard macro 30 among the searched passing wirings 40 in the wiring process (S4). In this case, a strain that is applied to the designer is reduced as compared with the techniques disclosed in JP Hei 10-10749A and JP Hei 11-145296A. That is, the designer does not need to give the attributes to all of the passing wirings (net), or arrange the bypass wiring within the hard macro. With the above configuration, in the layout design method for the semiconductor integrated circuit according to the present invention, the semiconductor integrated circuit can be designed so as to realize the higher integration, and not to strain the designer when developing the semiconductor integrated circuit that is insusceptible to noises.

Figure 10:
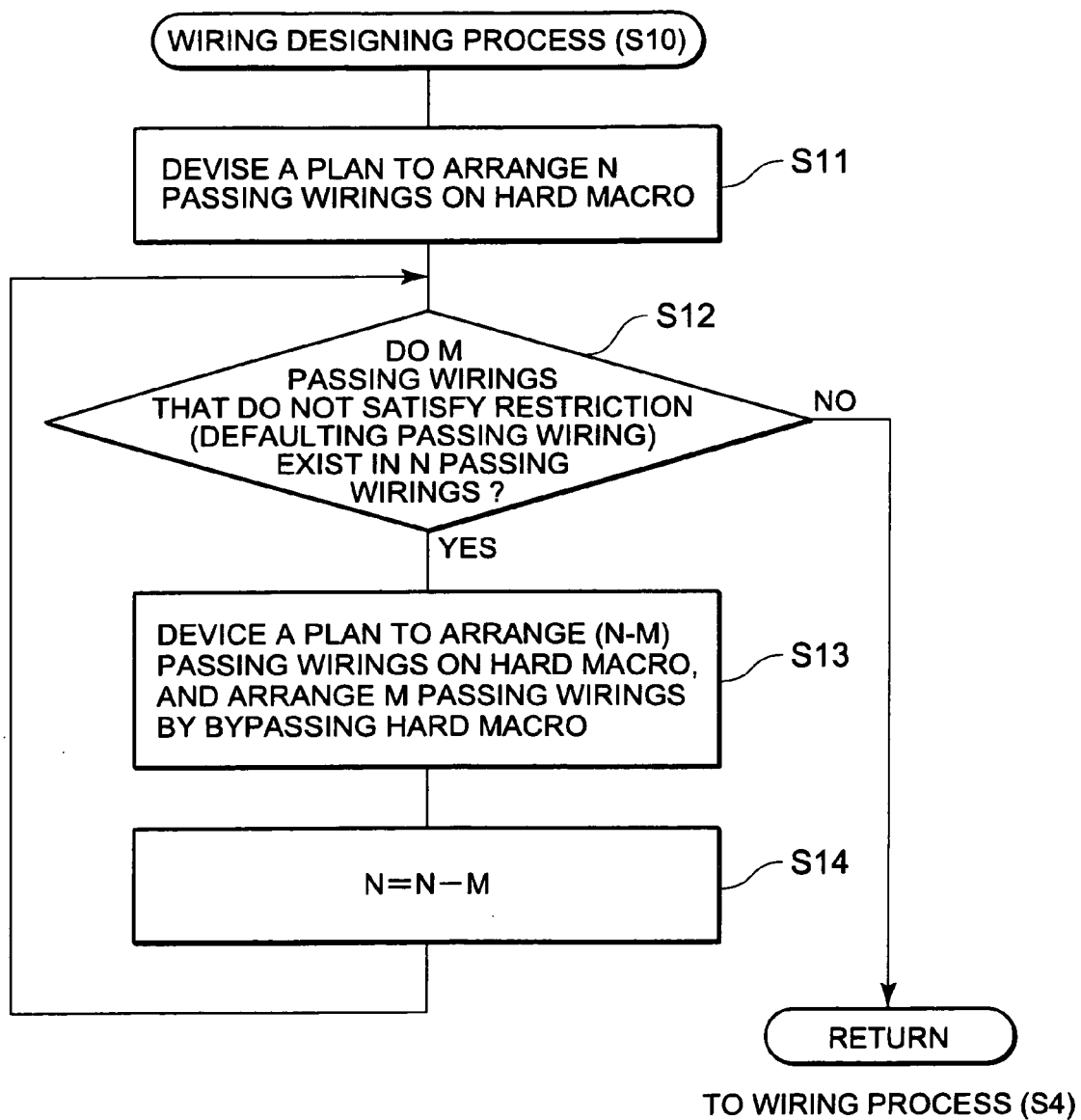
FIG. 10 is a flowchart showing a wiring planning process in FIG. 2.

FIG. 10 is a flowchart showing a wiring planning process (Step S10) shown in FIG. 2.

In the wiring planning process (Step S10), the wiring plan processing unit 13 devises a plan to virtually arrange all of the N passing wirings 40 on the given region 31, and changes the plan when the defaulting passing wiring 42 exists in the N passing wirings 40.

Figure 11A:
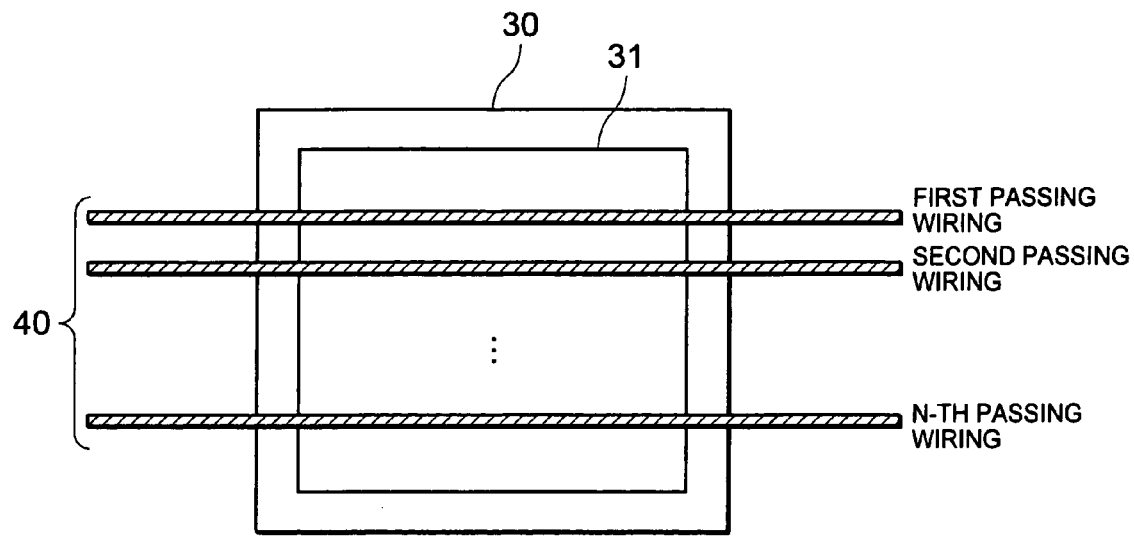
FIG. 11A is a diagram for explaining the wiring planning process in FIG. 2.

First, as shown in FIG. 11A, the wiring plan processing unit 13 devises a plan to virtually arrange the N first to N-th (N is an integer equal to or higher than 2) passing wirings 40 on the given region 31 (Step S11; first wiring planning process).

Subsequently, the wiring plan processing unit 13 searches whether the defaulting passing wiring 42 exists in the N passing wirings 40, or not (Step S12; searching process).

Figure 11B:
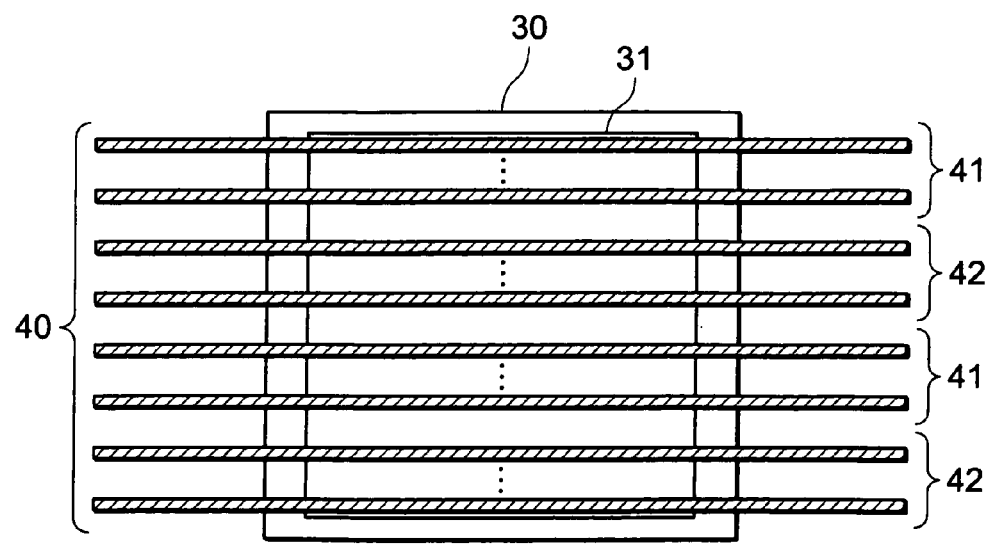
FIG. 11B is a diagram for explaining the wiring planning process.
Figure 11C:
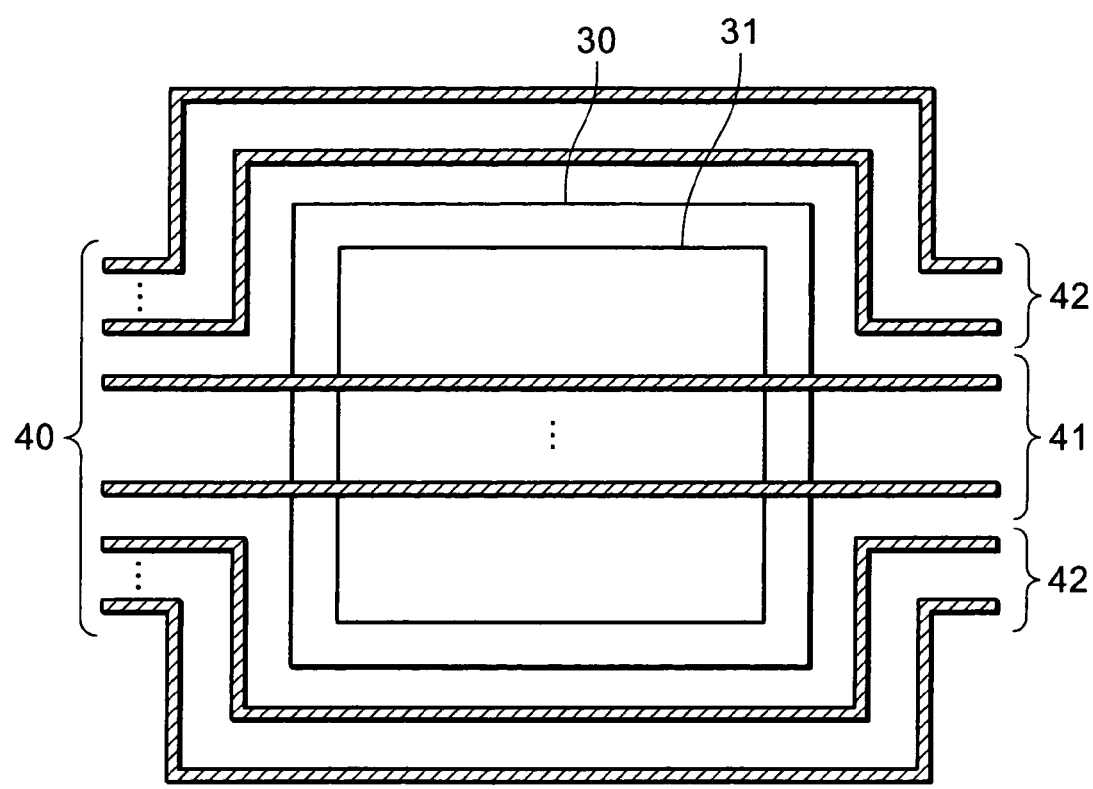
FIG. 11C is a diagram for explaining the wiring planning process.

As shown in FIG. 11B, M (M is an integer that satisfies M≦N) passing wirings 40 among the N passing wirings 40 are the defaulting passing wirings 42 (yes in Step S12). In this case, as shown in FIG. 11C, the wiring plan processing unit 13 devises a plan to virtually arrange (N−M) passing wirings 40 obtained by subtracting the M passing wirings 40 from the N passing wirings 40 on the hard macro 30, and virtually arrange the M passing wirings 40 so as to bypass the hard macro 30 (Step S13; second wiring planning process).

Subsequently, the wiring plan processing unit 13 provides the above (N−M) passing wirings 40 as the N passing wirings 40 (Step S14), and again executes the searching process (Step S12).

In this situation, the defaulting passing wiring 42 exists in the N passing wiring 40 (yes in Step S12). In this case, the wiring plan processing unit 13 again executes the second wiring planning process (Step S13).

On the other hand, no defaulting passing wiring 42 exists in the N passing wirings 40 (no in Step S12). In this case, the above wiring process (Step S4) is executed.

Second Embodiment

In the second embodiment, duplicated description with the first embodiment will be omitted.

Figure 12:
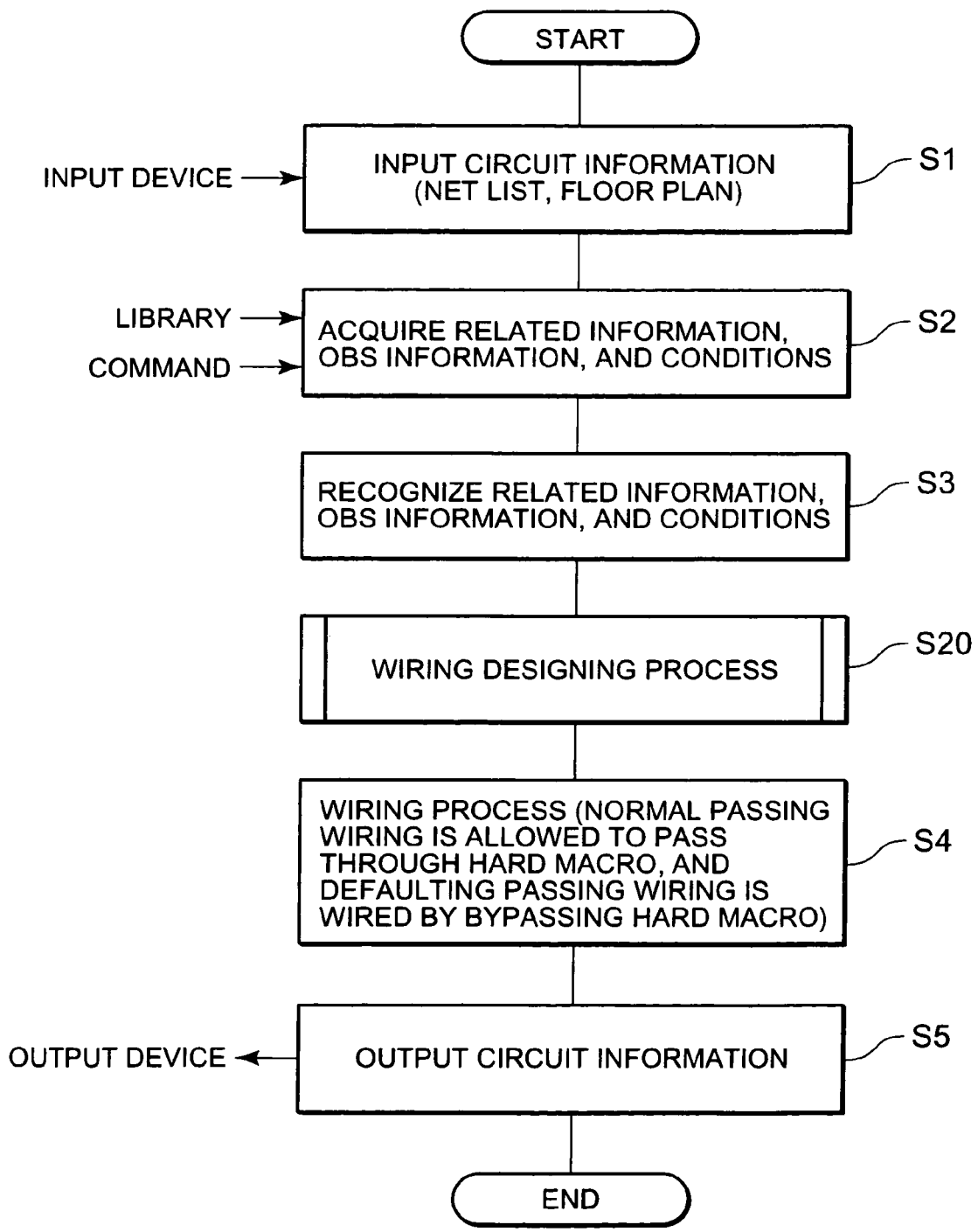
FIG. 12 is a flowchart showing the operation of a computer, which is representative of a layout design method for a semiconductor integrated circuit according to a second embodiment of the present invention.

FIG. 12 is a flowchart showing the operation of a computer, which is representative of a layout design method for a semiconductor integrated circuit according to a second embodiment of the present invention.

The wiring plan processing unit 13 executes a wiring planning process (Step S20) instead of the above wiring planning process (Step S10).

FIG. 13 is a flowchart showing a wiring planning process (Step S20) in FIG. 12.

In the wiring planning process (Step S20), the wiring plan processing unit 13 devises a plan to virtually arrange the N passing wirings 40 on the given region 31 one by one so that there exists no defaulting passing wiring 42 after the N passing wirings 40 are arranged.

Figure 14A:
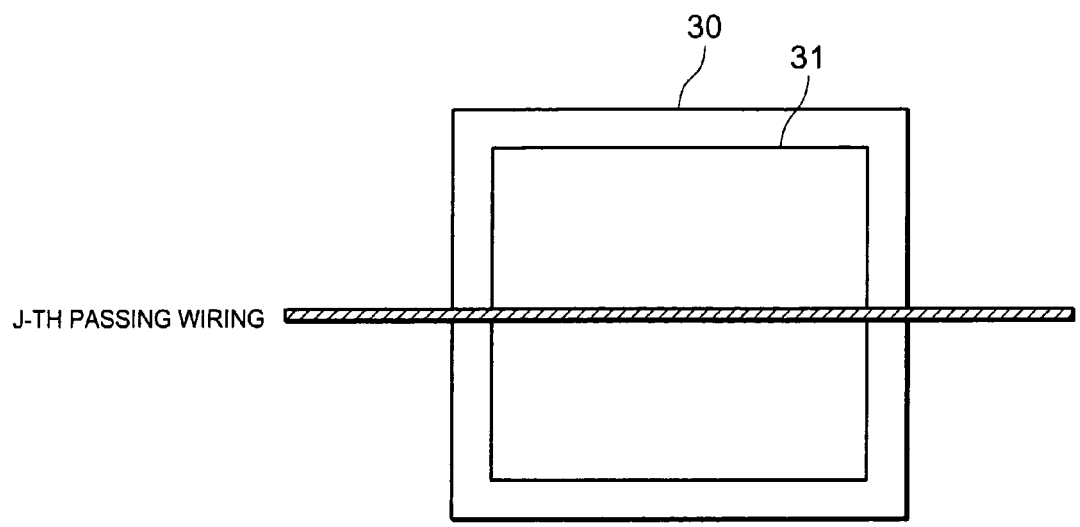
FIG. 14A is a diagram for explaining the wiring planning process.

First, as shown in FIG. 14A, the wiring plan processing unit 13 searches a J-th passing wiring 40 (J is an integer that satisfies 1≦J≦N) which is the longest in the wiring length when bypassing the hard macro 30 among the N first to N-th (N is an integer equal to or higher than 2) passing wirings 40 first to N-th (N is an integer equal to or higher than 2) passing wirings, and devises a plan to virtually arrange the J-th passing wiring on the hard macro 30 (Step S21; first wiring planning process).

Then, the wiring plan processing unit 13 searches whether the J-th passing wiring 40 is the defaulting passing wiring 42, or not (Step S22, searching process).

Figure 14B:
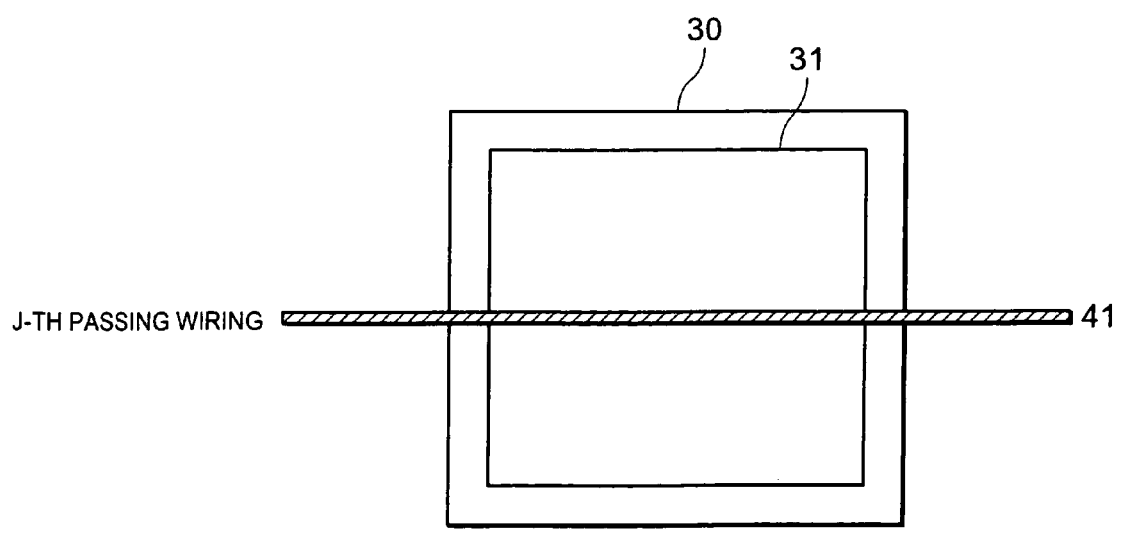
FIG. 14B is a diagram for explaining the wiring planning process.

As shown in FIG. 14B, the J-th passing wiring 40 is the normal passing wiring 41 (no in Step S22). In this case, the wiring plan processing unit 13 provides (N−1) passing wirings 40 obtained by subtracting the J-th passing wiring 40 from the N passing wirings 40 as the N passing wirings 40 (Step S23), and again executes the first wiring planning process (Step S21) when N does not represent 0 (no in Step S24).

Figure 14C:
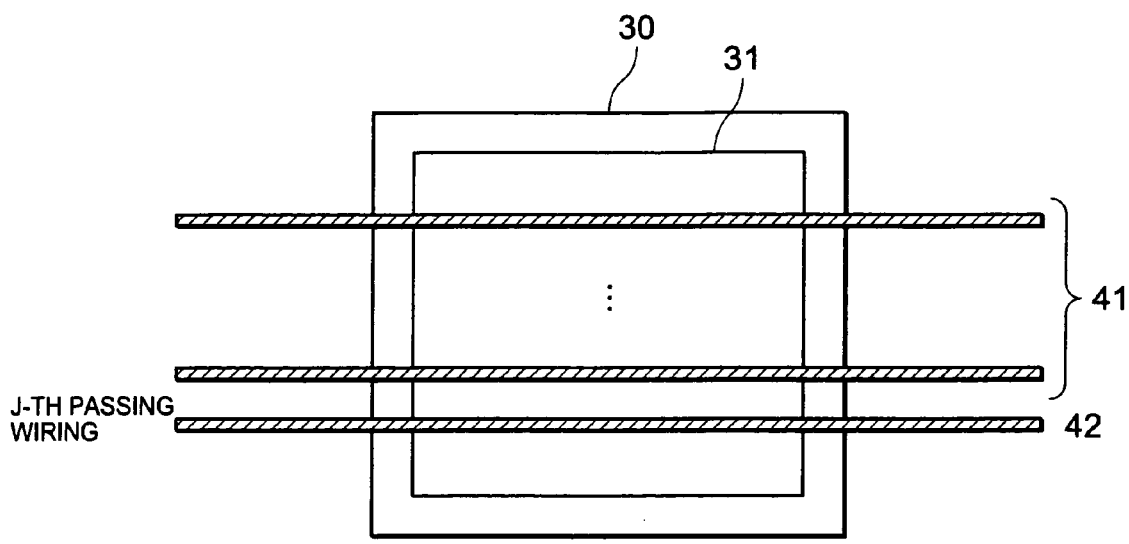
FIG. 14C is a diagram for explaining the wiring planning process.
Figure 14D:
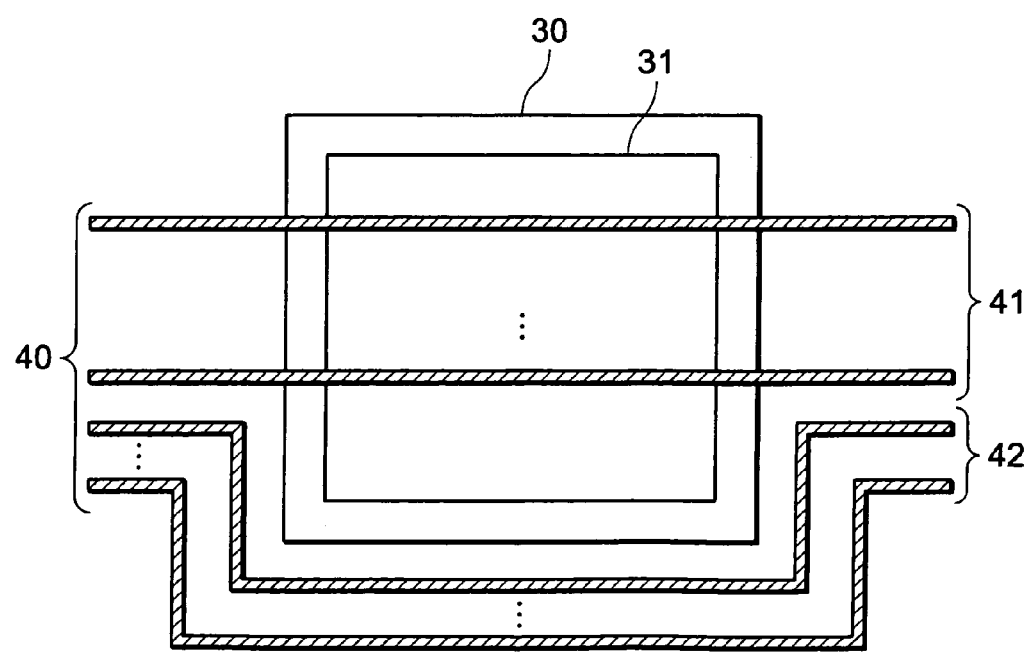
FIG. 14D is a diagram for explaining the wiring planning process.

On the other hand, as shown in FIG. 14C, the J-th passing wiring 40 is the defaulting passing wiring 42 (Yes in Step S22). In this case, as shown in FIG. 14D, the wiring plan processing unit 13 devises a plan to virtually arrange the N passing wirings 40 that are remaining passing wirings 40 so as to bypass the hard macro 30 (Step S25; second wiring planning process).

The above second wiring planning process (Step S25) is executed, or N represents 0 (yes in Step S24). In this case, the above wiring process (Step S4) is executed.

Third Embodiment

In a third embodiment, the duplicated description with the first and second embodiments will be omitted.

Figure 15:
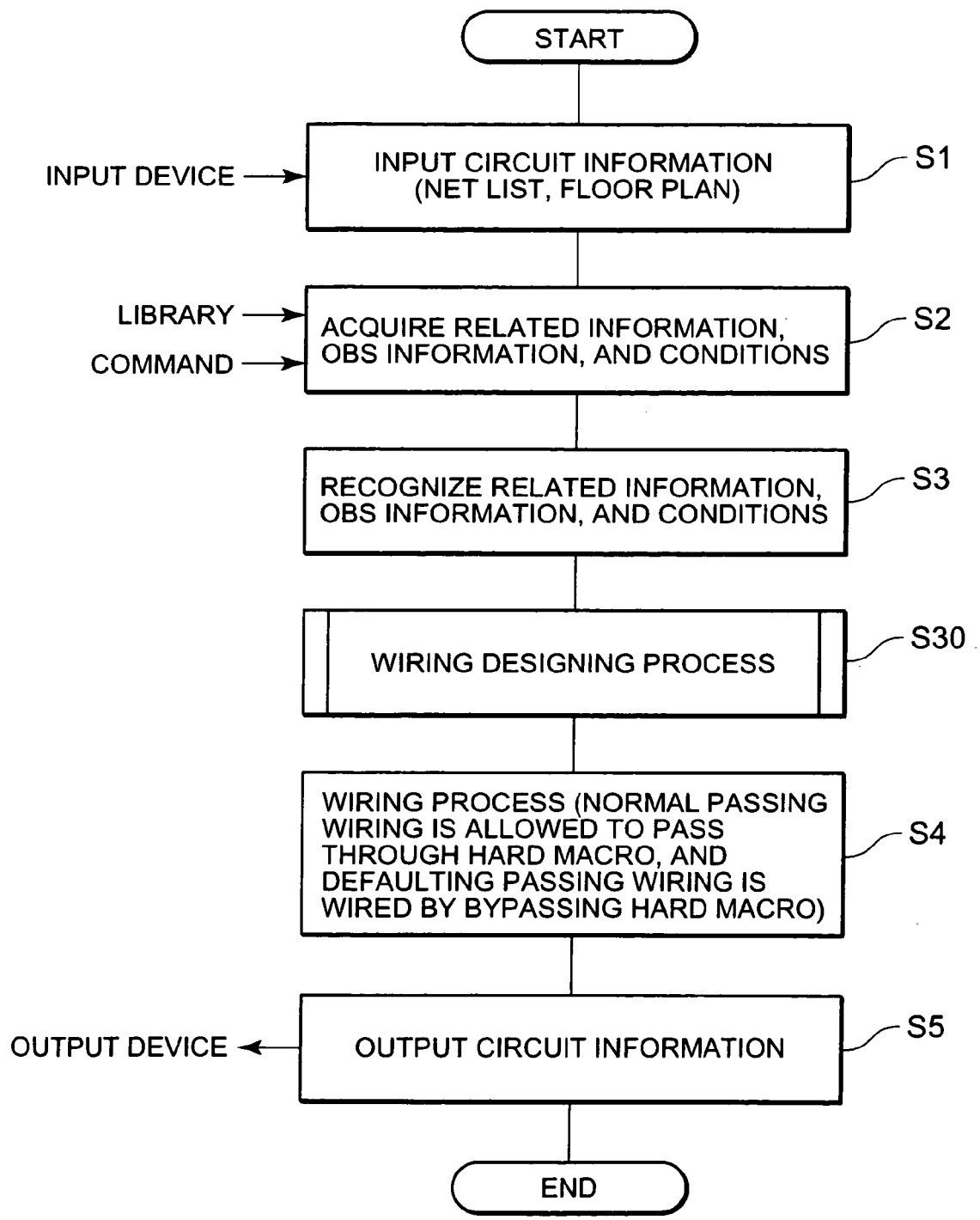
FIG. 15 is a flowchart showing the operation of a computer, which is representative of a layout design method for a semiconductor integrated circuit according to a third embodiment of the present invention.

FIG. 15 is a flowchart showing the operation of the computer 1, which is representative of a layout design method for a semiconductor integrated circuit according to a third embodiment of the present invention.

The wiring plan processing unit 13 executes the wiring planning process (Step S30) instead of the above wiring planning process (Step S10).

Figure 16A:
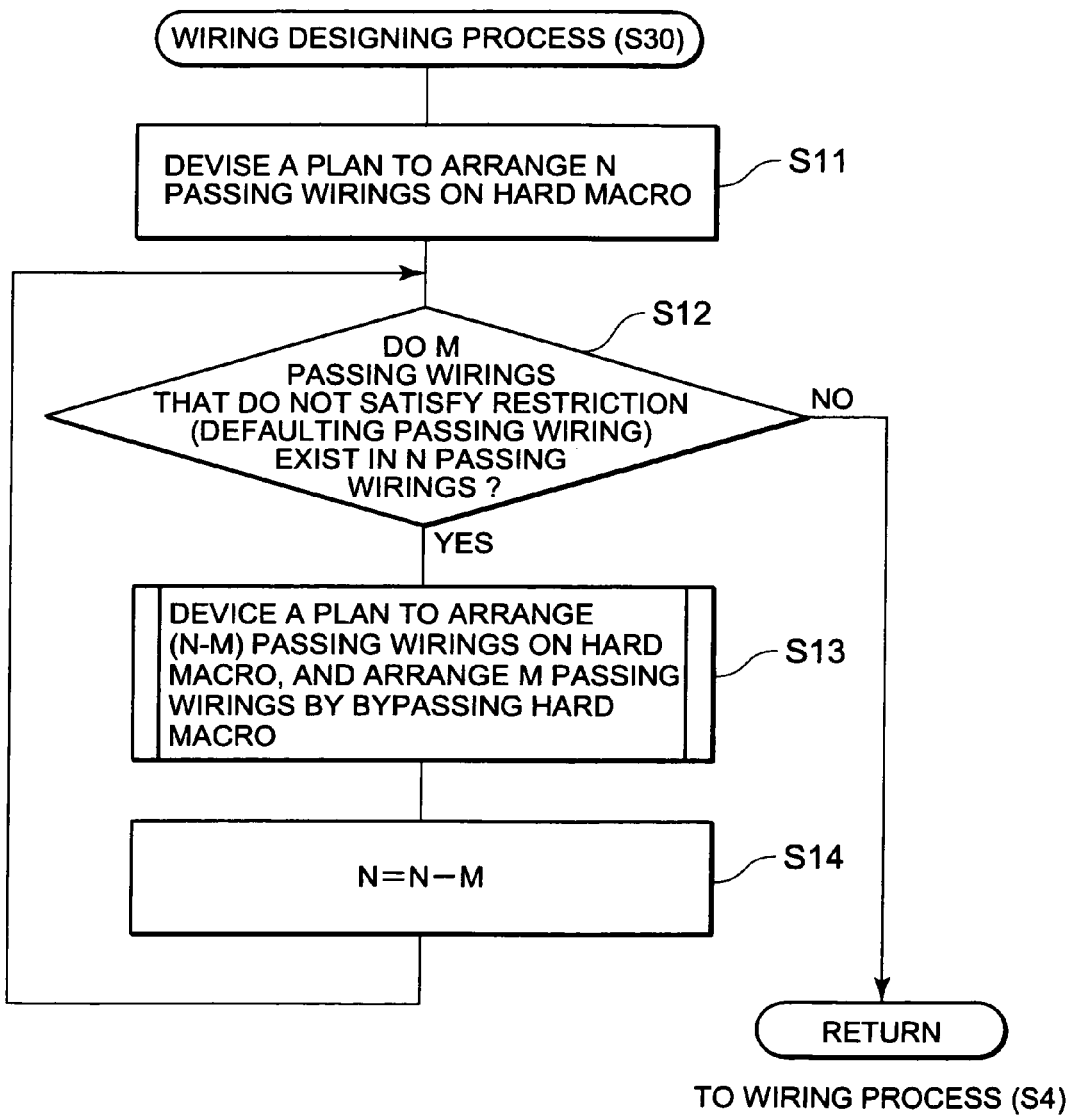
FIG. 16A is a flowchart showing a wiring planning process in FIG. 15.
Figure 16B:
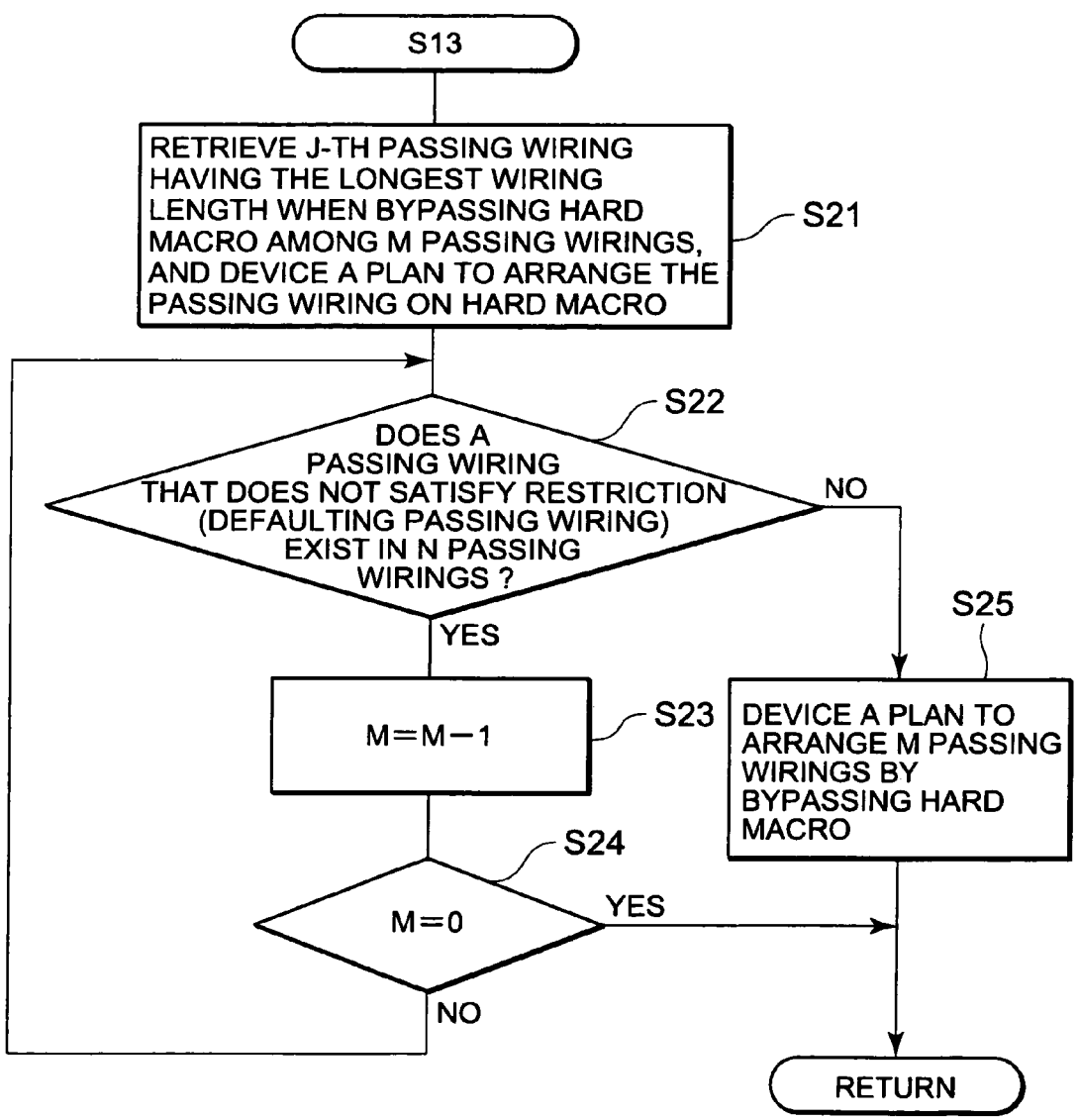
FIG. 16B is a flowchart showing the wiring planning process in FIG. 15.

FIGS. 16A and 16B are flowcharts showing a wiring planning process (Step S30) in FIG. 15, respectively.

In the wiring planning process (Step S30), the wiring plan processing unit 13 executes the above wiring planning process (Step S10) and the above wiring planning process (Step S20). In this case, the wiring plan processing unit 13 executes the above wiring planning process (Step S20) as the Step S13 of the above wiring planning process (Step S10). This process will be described below.

First, the wiring plan processing unit 13 devises a plan to virtually arrange the N first to N-th (N is an integer equal to or higher than 2) passing wirings 40 on the given region 31 (Step S11; first wiring planning process).

Subsequently, the wiring plan processing unit 13 searches whether the defaulting passing wiring 42 exists in the N passing wirings 40, or not (Step S12; first searching process).

The M (M is an integer that satisfies M≦N) passing wirings 40 among the N passing wirings 40 are the defaulting passing wirings 42 (yes in Step S12). In this case, the wiring plan processing unit 13 devises a plan to virtually arrange (N−M) passing wirings 40 obtained by subtracting the M passing wirings 40 from the N passing wirings 40 on the given region 31, and virtually arrange the M passing wirings 40 so as to bypass the hard macro 30 (Step S13; second wiring planning process).

In the second wiring planning process (Step S13), the wiring plan processing unit 13 searches the J-th passing wiring 40 (J is an integer that satisfies 1≦J≦N) which is the longest in the wiring length when bypassing the hard macro 30 among the M passing wirings 40, and devises a plan to virtually arrange the J-th passing wiring on the given region 31 (Step S21; third wiring planning process).

Subsequently, the wiring plan processing unit 13 searches whether the J-th passing wiring 40 is the defaulting passing wiring 42, or not (Step S22, second searching process).

When the J-th passing wiring 40 is the normal passing wiring 41 (no in Step S22). In this case, the wiring plan processing unit 13 provides (M-1) passing wirings 40 obtained by subtracting the J-th passing wiring 40 from the M passing wirings 40 as the M passing wirings 40 (Step S23), and again executes the third wiring planning process (Step S21) when M does not represent 0 (no in Step S24).

On the other hand, the J-th passing wiring 40 is the defaulting passing wiring 42 (Yes in Step S22). In this case, the wiring plan processing unit 13 devises a plan to virtually arrange the M passing wirings 40 so as to bypass the hard macro 30 (Step S25; fourth wiring planning process).

The above fourth wiring planning process (Step S25) is executed, or M represents 0 (yes in Step S24). In this case, the wiring plan processing unit 13 again executes the first searching process (Step S12).

In this situation, the defaulting passing wiring 42 exists in the N passing wirings 40 (yes in Step S12). In this case, the wiring plan processing unit 13 again executes the second wiring planning process (Step S21).

On the other hand, no defaulting passing wiring 42 exists in the N passing wirings 40 (no in Step S12). In this case, the above wiring process (Step S4) is executed.

With the above description, in the layout design method for the semiconductor integrated circuit according to the present invention, the semiconductor integrated circuit can be designed so as to realize the higher integration, and not to strain the designer when developing the semiconductor integrated circuit that is insusceptible to noises.

This is because the designer provides a computer 1 with the admissibility condition 23 for permitting the predetermined wiring with respect to the given region 31 within the hard macro 30 in advance, and the computer 1 searches the passing wiring 40 that passes through the given region 31 from the wirings that are arranged in the semiconductor integrated circuit in the wiring design step (S10, S20, and S30), allows the normal passing wiring 41 that satisfies the admissibility condition 23 to pass through the hard macro 30 among the searched passing wirings 40, and wires the defaulting passing wiring 42 that does not satisfy the admissibility condition 23 so as to bypass the hard macro 30 in the wiring step (Step S4). In this case, the designer is required to only supply the admissibility condition 23 to the library 20 for the design tool, or to the design tool by a command, and reduces a strain of the designer as compared with the technique disclosed in JP Hei 10-107149 or JP Hei 11-145296. That is, the designer does not need to supply the attributes to all of the passing wirings (net), or arrange the bypass wiring within the hard macro.

The admissibility condition 23 is exemplified by an allowable capacitance Co, an allowable resistance Ro, an allowable number, and an allowable area Qo.

When the allowable condition 23 includes the allowable capacitance Co, the defaulting passing wiring 42 represents that the capacitance C representative of the coupling capacitor which is formed by the passing wiring 40 that is virtually arranged on the given region 31 and the wiring of the hard macro 30 exceeds the allowable capacitance Co. In this case, it is preferable to calculate the value of the coupling capacitance which is formed by the overlap portion 40-2 representative of a portion corresponding to the given region 31 of the passing wiring 40 and the wiring of the hard macro 30 in the given region 31 as the capacitance C.

When the admissibility condition 23 includes the admissibility resistance Ro, the defaulting passing wiring 42 represents that the resistance R representative of a resistance which occur in the passing wiring 40 that is virtually arranged on the given region 31 exceeds the allowable resistance Ro. In this case, it is preferable to calculate the value of the resistor that occurs in the overlap portion 40-2 representative of a portion corresponding to the given region 31 of the passing wiring 40 as the resistance R.

When the admissibility condition 23 includes the allowable number, and the allowable number is I (I is an integer equal to or higher than 1), the defaulting passing wiring 42 represents that the passing wirings 40 that are virtually arranged on the given region 31 are (I+1)-th and subsequent passing wirings.

When the admissibility condition 23 includes the allowable area Qo, the normal passing wirings 41 represents the first to K-th (K is an integer equal to or higher than 1) passing wirings 40 when a total area Qtotal that is determined by the areas Qi and the number of passing wirings 40 which are virtually arranged on the given region 31 is equal to or lower than the allowable area Qo. In this case, the defaulting passing wirings 42 represent (K+1)-th and subsequent passing wirings 40 when the total area Q total exceeds the allowable area Qo. It is preferable to calculate the area of the overlap portion 40-2 representative of a portion corresponding to the given region 31 of the passing wirings 40 as the area Qi.

In the wiring design step (Step S10), the computer 1 devises a plan to virtually arrange all of N passing wirings 40 on the given region 31, and changes the plan when the defaulting passing wiring 42 exists in the N passing wirings 40. When the order of wiring of the N passing wirings 40 can be changed, it is preferable to execute the wiring design step (Step S10).

In the wiring plan step (Step S20), the computer 1 devises a plan to virtually arrange the N passing wirings 40 in the given region 31 one by one so that the defaulting passing wirings 42 do not exist after the N passing wirings 40 are arranged. When the order of wiring of the N passing wirings 40 is not desired to be changed, it is preferable to execute the wiring planning step (Step S20).

In the wiring plan step (Step S30), the computer 1 devises a plan to virtually arrange all of the N passing wirings 40 on the given region 31, and changes the plan when the defaulting passing wiring 42 exists in the N passing wirings 40. In this example, when M (M is an integer that satisfies M≦N) defaulting passing wirings 42 exist in the N passing wirings 40, the computer 1 devises a plan to virtually arrange M passing wirings 40 on the given region 31 one by one. In this way, it is possible to execute the wiring plan step (Step S10) and the wiring plan step (Step S20).

It is apparent that the present invention is not limited to the above embodiments, but may be modified and changed without departing from the scope and sprit of the invention.

What is claimed is:

1. A method, performed in a processor in a computer, of designing a layout of a semiconductor integrated circuit having a hard macro, comprising:

acquiring circuit information of the semiconductor integrated circuit, and an admissibility condition for permitting a wiring with respect to a given region within the hard macro to avoid a malfunction of the hard macro when wirings are arranged in the given region to pass through the hard macro;

searching, using said processor, N passing wirings, N being a positive integer, which pass through the given region among wirings which are arranged in the semiconductor integrated circuit;

determining whether each of the N passing wirings satisfies the admissibility condition; and wiring a normal passing wiring which satisfies the admissibility condition among the N passing wirings so as to pass through the hard macro, and a defaulting passing wiring which does not satisfy the admissibility condition so as to bypass the hard macro.

2. The method of designing a layout of a semiconductor according to claim 1, wherein the admissibility condition includes an allowable capacitance value, and wherein a capacitance value of a coupling capacitor which is formed between the normal passing wiring and a wiring of the hard macro in the given region is equal to or lower than the allowable capacitance value.

3. The method of designing a layout of a semiconductor according to claim 2, wherein the capacitance value of the coupling capacitance comprises a capacitance formed by an overlap portion corresponding to the given region and the wiring of the hard macro in the given region.

4. The method of designing a layout of a semiconductor according to claim 1, wherein the admissibility condition includes an allowable resistance value, and wherein a resistance value of the normal passing wiring in the given region is equal to or lower than the allowable resistance value.

5. The method of designing a layout of a semiconductor according to claim 4, wherein the resistance value represents a resistance value of a wiring which overlaps the normal passing wiring and the given region.

6. The method of designing a layout of a semiconductor according to claim 1, wherein the admissibility condition includes an allowable wiring number, and wherein the determining allows I passing wirings, I being a positive integer equal to or lower than the allowable wiring number, among the N passing wirings to pass through the hard macro.

7. The method of designing a layout of a semiconductor according to claim 1, wherein the admissibility condition includes an allowable area, wherein the determining allows I passing wirings, J being a positive integer, among the N passing wirings to pass through the hard macro, and wherein a total area of the J passing wirings equal to or lower than the allowable area.

8. The method of designing a layout of a semiconductor according to claim 7, wherein the total area represents an area of a portion which overlaps the J passing wirings and the given region.

9. The method of designing a layout of a semiconductor according to claim 1, wherein the searching searches the N passing wirings by temporarily arranging the wirings in accordance with the circuit information, and wherein the determining comprises:

searching K defaulting passing wirings, K being a positive integer, which does not satisfy the admissibility condition among the N passing wirings;

temporarily rearranging (N-K) passing wirings upon the K not being zero; and allowing the rearranged (N-K) passing wirings to pass through the hard macro upon the rearranged (N-K) passing wirings satisfying the admissibility condition.

10. The method of designing a layout of a semiconductor according to claim 1, wherein the circuit information comprises a net list, said net list comprising circuits that constitute the hard macro.

11. The method of designing a layout of a semiconductor according to claim 1, wherein the circuit information comprises a floor plan representing coordinates of a location where the semiconductor integrated circuit is arranged.

12. The method of designing a layout of a semiconductor according to claim 1, wherein the admissibility condition comprises information for permitting a predetermined wiring with respect to the given region and coordinates representative of a region that is subject to said information.

13. A computer program product tangibly embodied on a non-transitory computer-readable storage medium and comprising code that, when executed, causes a computer to perform a method, comprising:

acquiring circuit information of the semiconductor integrated circuit, and an admissibility condition for permitting a wiring with respect to a given region within a hard macro to avoid a malfunction of the hard macro when wirings are arranged in the given region to pass through the hard macro;

searching N passing wirings, N being a positive integer, which pass through the given region among wirings which are arranged in the semiconductor integrated circuit;

determining whether each of the N passing wirings satisfies the admissibility condition; and wiring a normal passing wiring which satisfies that admissibility condition among the N passing wirings so as to pass through the hard macro, and a defaulting passing wiring which does not satisfy the admissibility condition so as to bypass the hard macro.

14. The computer program product according to claim 13, wherein the admissibility condition includes an allowable capacitance value, and wherein a capacitance value of a coupling capacitor which is formed between the normal passing wiring and a wiring of the hard macro in the given region is equal to or lower than the allowable capacitance value.

15. The computer program product according to claim 13, wherein the admissibility condition includes an allowable resistance value, and wherein a resistance value of the normal passing wiring in the given region is equal to or lower than the allowable resistance value.

16. The computer program product according to claim 15, wherein the resistance value represents a resistance value of a wiring which overlaps the normal passing wiring and the given region.

17. The computer program product according to claim 13, wherein the admissibility condition includes an allowable wiring number, and wherein the determining allows J passing wirings, J being a positive integer equal to or lower than the allowable wiring number, among the N passing wirings to pass through the hard macro.

18. The computer program product according to claim 13, wherein the admissibility condition includes an allowable area, wherein the determining allows J passing wirings, J being a positive integer, among the N passing wirings to pass through the hard macro, and wherein a total area of the J passing wirings equal to or lower than the allowable area.

19. The computer program product according to claim 18, wherein the total area represents an area of a portion which overlaps the J passing wirings and the given region.

20. The computer program product according to claim 13, wherein the searching searches the N passing wirings by temporarily arranging the wirings in accordance with the circuit information, and wherein the determining comprises:

searching K defaulting passing wirings, K being a positive integer, which does not satisfy the admissibility condition among the N passing wirings;

temporarily rearranging (N-K) passing wirings upon the K not being zero; and allowing the rearranged (N-K) passing wirings to pass through the hard macro upon the rearranged (N-K) passing wirings satisfying the admissibility condition.

* * * * *